(12) United States Patent
Yeh et al.

(10) Patent No.: US 11,682,654 B2
(45) Date of Patent: Jun. 20, 2023

(54) SEMICONDUCTOR STRUCTURE HAVING A SENSOR DEVICE AND METHOD OF MANUFACTURING THE SAME

(71) Applicant: Taiwan Semiconductor Manufacturing Co., Ltd., Hsinchu (TW)

(72) Inventors: Der-Chyang Yeh, Hsin-Chu (TW); Li-Hsien Huang, Hsinchu County (TW); Ta-Hsuan Lin, Hsinchu (TW); Ming-Shih Yeh, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/718,073

(22) Filed: Dec. 17, 2019

(65) Prior Publication Data

US 2021/0183813 A1 Jun. 17, 2021

(51) Int. Cl.
*H01L 23/498* (2006.01)
*H01L 25/065* (2023.01)
*H01L 23/31* (2006.01)

(52) U.S. Cl.
CPC ...... *H01L 25/0657* (2013.01); *H01L 23/3114* (2013.01); *H01L 23/49822* (2013.01); *H01L 23/49827* (2013.01)

(58) Field of Classification Search
CPC .......... H01L 25/0657; H01L 23/49822; H01L 23/49827; H01L 23/3114; H01L 21/56; H01L 2224/33181; H01L 23/562; H01L 31/0203; H01L 27/14643; H01L 21/6836; H01L 25/167; H01L 2224/023–024; H01L 2224/05011–05019; H05K 2201/09827–09863; H05K 2201/09036; H05K 2201/09063; H05K 2201/09072
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |

(Continued)

*Primary Examiner* — Phat X Cao
*Assistant Examiner* — William Henry Anderson
(74) *Attorney, Agent, or Firm* — JCIPRNET

(57) ABSTRACT

A semiconductor structure includes a semiconductor structure includes a semiconductor die, an insulating encapsulation, a passivation layer and conductive elements. The semiconductor die includes a sensor device and a semiconductor substrate with a first region and a second region adjacent to the first region, and the sensor device is embedded in the semiconductor substrate within the first region. The insulating encapsulation laterally encapsulates the semiconductor die and covers a sidewall of the semiconductor die. The passivation layer is located on the semiconductor die, wherein a recess penetrates through the passivation layer over the first region and is overlapped with the sensor device. The conductive elements are located on the passivation layer over the second region and are electrically connected to the semiconductor die, wherein the passivation layer is between the insulating encapsulation and the conductive elements.

20 Claims, 14 Drawing Sheets

(56) References Cited

U.S. PATENT DOCUMENTS

| | | | |
|---|---|---|---|
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2009/0315131 A1* | 12/2009 | Hung | H01L 27/14632 257/E31.127 |
| 2015/0259194 A1* | 9/2015 | Lin | H01L 24/19 257/773 |
| 2015/0348917 A1* | 12/2015 | Tsai | H01L 25/0657 257/774 |
| 2016/0212851 A1* | 7/2016 | Hu | H05K 1/185 |
| 2017/0005035 A1* | 1/2017 | Chen | H01L 23/3185 |
| 2018/0286824 A1* | 10/2018 | Jeng | H01L 24/20 |
| 2019/0189667 A1* | 6/2019 | Jung | H01L 24/20 |
| 2019/0267421 A1* | 8/2019 | Suzuki | H01L 27/14623 |
| 2019/0305027 A1* | 10/2019 | Qian | H01L 21/76898 |
| 2020/0020734 A1* | 1/2020 | Wang | H01L 27/14636 |
| 2020/0127031 A1* | 4/2020 | Suzuki | H01L 27/14692 |
| 2021/0005761 A1* | 1/2021 | Tsai | H01L 25/162 |

\* cited by examiner

SEMICONDUCTOR STRUCTURE HAVING A SENSOR DEVICE AND METHOD OF MANUFACTURING THE SAME

BACKGROUND

Semiconductor image sensors are used to sense radiation such as light. Complementary metal-oxide-semiconductor (CMOS) image sensors (CIS) and charge-coupled device (CCD) sensors are widely used in various applications such as digital still camera or mobile phone camera applications. These devices utilize an array of pixels in a substrate, including photodiodes and transistors, where the photodiodes absorb radiation projected toward the substrate and convert the sensed radiation into electrical signals.

In recent years, the semiconductor integrated circuit (IC) industry has experienced rapid growth. Technological advances in IC materials and design have produced generations of ICs where each generation has smaller and more complex circuits than the previous generation. As a part of the IC evolution for semiconductor image sensors, the size of the radiation-sensitive pixels has been steadily reduced, which needs to seek for various technologies for increasing the quantum efficiency of image sensors are seek.

BRIEF DESCRIPTION OF THE DRAWINGS

Aspects of the disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
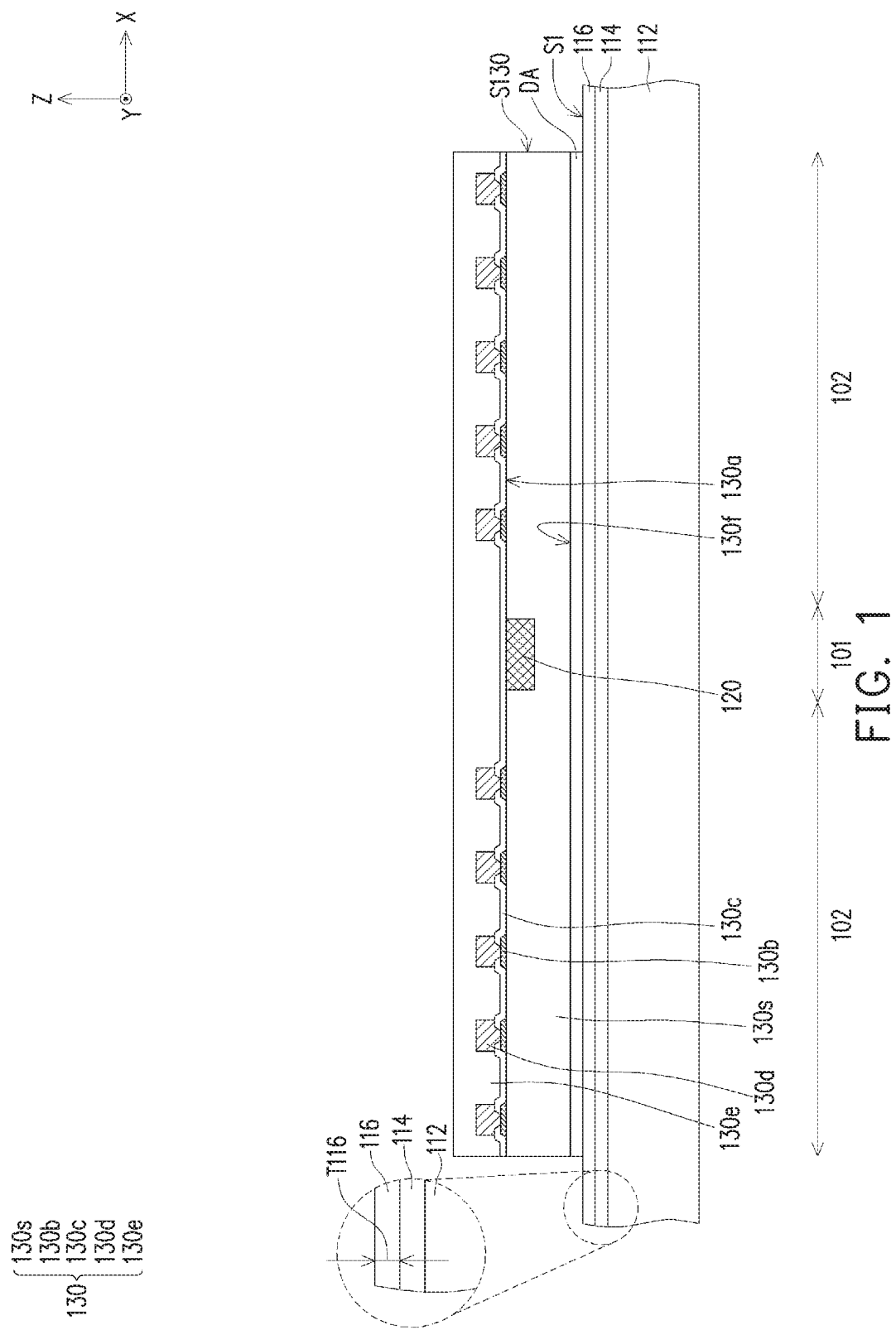
FIG. 1 through FIG. 7 are schematic cross-sectional views of various stages in a manufacturing method of a semiconductor structure in accordance with some embodiments of the disclosure.

The following disclosure provides many different embodiments, or examples, for implementing different features of the provided subject matter. Specific examples of components, values, operations, materials, arrangements, or the like, are described below to simplify the disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first", "second", "third" and the like, may be used herein for ease of description to describe similar or different element(s) or feature(s) as illustrated in the figures, and may be used interchangeably depending on the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 8:
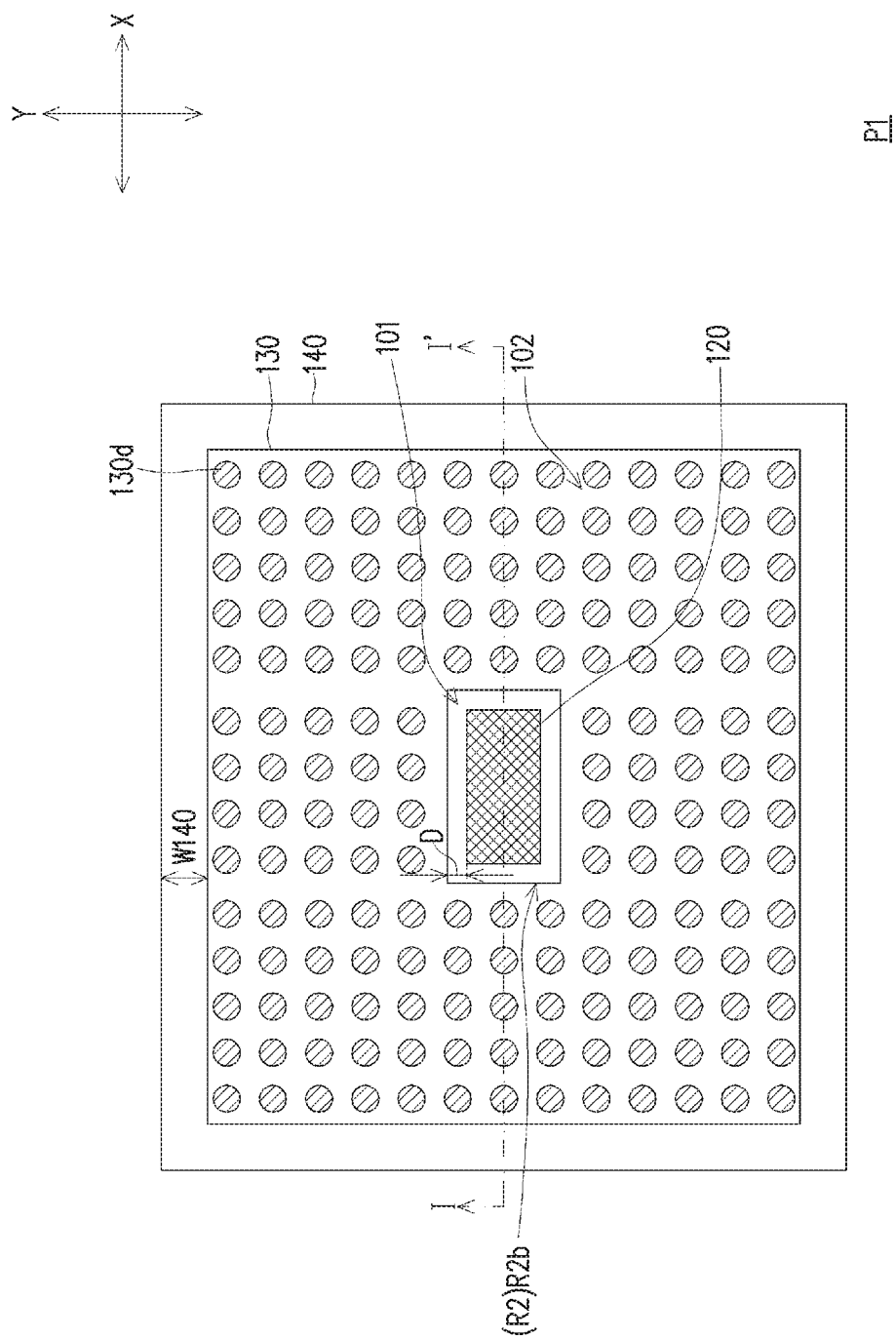
FIG. 8 is a schematic top view respectively illustrating a positioning location of a sensor device in a semiconductor structure in accordance with some embodiments of the disclosure.
Figure 9:
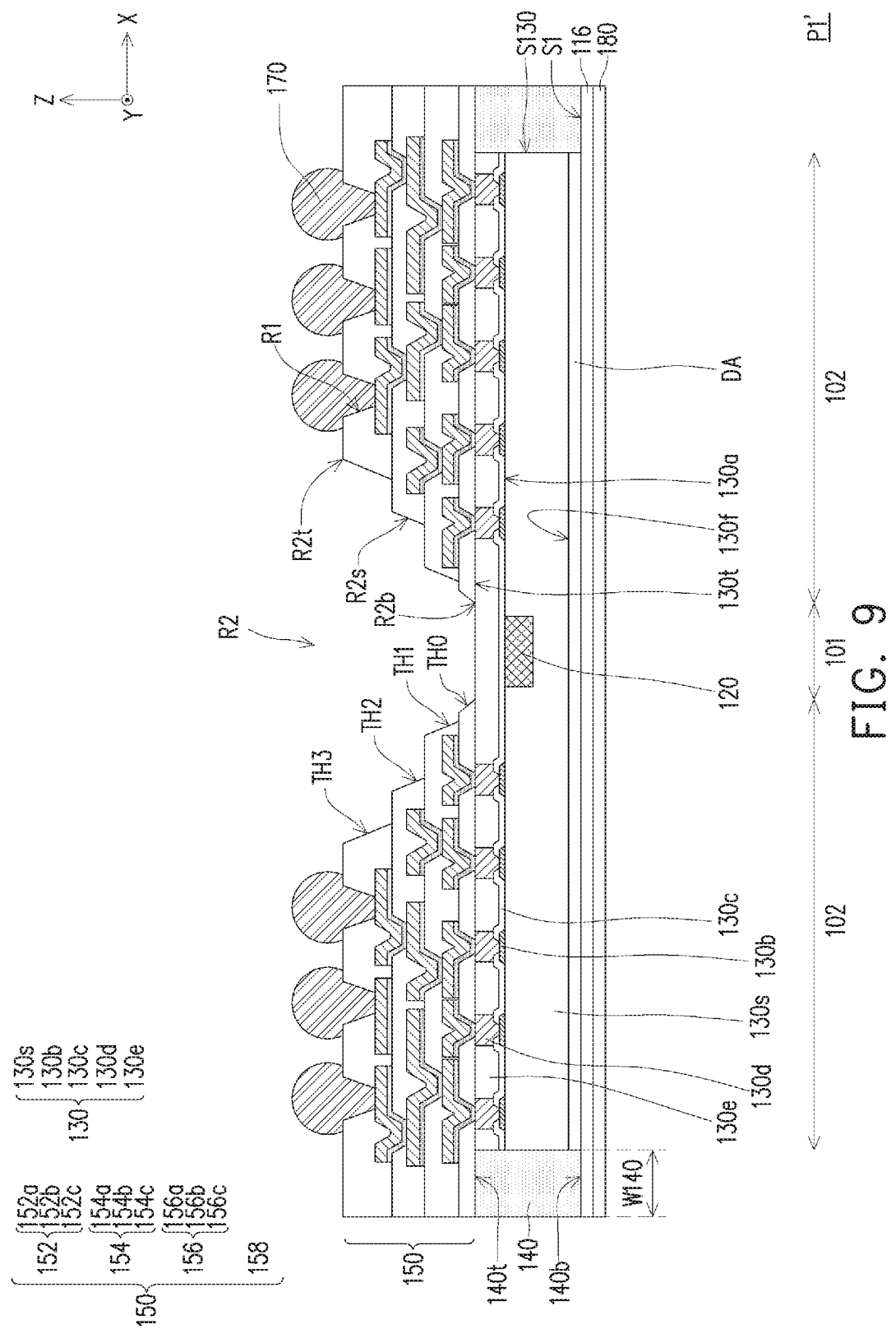
FIG. 9 is a schematic cross-sectional view of a semiconductor structure in accordance with some embodiments of the disclosure.

FIG. 1 through FIG. 7 are schematic cross-sectional views of various stages in a manufacturing method of a semiconductor structure in accordance with some embodiments of the disclosure. FIG. 8 is a schematic top view respectively illustrating a positioning location of a sensor device relative to other components in a semiconductor structure in accordance with some embodiments of the disclosure. FIG. 9 is a schematic cross-sectional view of a semiconductor structure in accordance with some embodiments of the disclosure. For example, FIG. 1 through FIG. 7 and FIG. 9 are the cross-sectional views taken along a cross-sectional line I-I' depicted in FIG. 8. In some embodiments, the manufacturing method is part of a wafer level packaging process. In FIG. 1 to FIG. 7 and FIG. 9, one (semiconductor) chip or dies is shown to represent plural (semiconductor) chips or dies of the wafer, and one semiconductor structure are shown to represent plural semiconductor structures obtained following the (semiconductor) manufacturing method, the disclosure is not limited thereto. In an alternative embodiment, one or more than one (semiconductor) chip or die may be shown to represent plural (semiconductor) chips or dies of the wafer, and one or more than one semiconductor structure may be shown to represent plural semiconductor structures obtained following the (semiconductor) manufacturing method.

Referring to FIG. 1, in some embodiments, a carrier 112 with a debond layer 114 and a buffer layer 116 coated thereon is provided. The carrier 112 may be a glass carrier or any suitable carrier for carrying a semiconductor wafer or a reconstituted wafer for the manufacturing method of the semiconductor structure. The disclosure is not limited thereto. In some embodiments, as shown in FIG. 1, the debond layer 114 is disposed on the carrier 112. The material of the debond layer 114 may be any material suitable for bonding and debonding the carrier 112 from the above layer(s) (e.g., the buffer layer 116) or any wafer(s) disposed thereon. In some embodiments, the debond layer 114 includes a release layer (such as a light-to-heat conversion ("LTHC") layer) or an adhesive layer (such as an ultra-violet curable adhesive or a heat curable adhesive layer). The top surface of the debond layer 114 may be levelled and may have a high degree of coplanarity.

In some embodiments, as shown in FIG. 1, the buffer layer 116 is disposed on the debond layer 114, and the debond layer 114 is located between the carrier 112 and the buffer layer 116. In the disclosure, the buffer layer 116 is made of a dielectric material layer. In some embodiments, the buffer layer 116 may be a polymer layer which made of polyimide (PI), polybenzoxazole (PBO), benzocyclobutene (BCB), or any other suitable polymer-based dielectric material. In other embodiments, the buffer layer 116 may be Ajinomoto buildup film (ABF), solder resist film (SR), or the like. In some embodiments, a thickness T116 of the buffer layer 116 is approximately ranging from 5 μm to 50 μm. The top surface of the buffer layer 116 is leveled and has a high degree of coplanarity, for example. The debond layer 114 and the buffer layer 116 may be formed by a suitable fabrication technique such as spin-coating, lamination, deposition, or the like. However, the disclosure is not specifically limited thereto.

In some embodiments, as shown in FIG. 1, at least one semiconductor die 130 is provided. For example, only one semiconductor die 130 is shown for illustrative purposes, however, it should be noted that the number of the semiconductor die 130 may be one or more than one, the disclosure is not limited thereto.

In some embodiments, the semiconductor die 130 includes a semiconductor substrate 130s having an active surface 130a and a bottom surface 130f opposite to the active surface 130a, a plurality of connection pads 130b distributed on the active surface 130a, a passivation layer 130c covering the active surface 130a and a portion of each of the connection pads 130b, a plurality of connection vias 130d respectively connecting to the connection pads 130b exposing by the passivation layer 130c, and a protection layer 130e disposed on and covering the passivation layer 130c and the connection vias 130d. The connection pads 130b, the passivation layer 130c, the connection vias 130d, and the protection layer 130e are formed on the semiconductor substrate 130s in sequence. The connection pads 130b are partially exposed by the passivation layer 130c, the connection vias 130d are respectively disposed on and electrically connected to the connection pads 130b, and the protection layer 130e completely covers the connection vias 130d and the passivation layer 130c exposed by the connection vias 130d. However, the disclosure may not be limited thereto.

Alternatively, the connection vias 130d and the protection layer 130e may be omitted. For example, the semiconductor die 130 includes only the semiconductor substrate 130s having the active surface 130a and the bottom surface 130f opposite to the active surface 130a, the plurality of connection pads 130b distributed on the active surface 130a, and the passivation layer 130c covering the active surface 130a and a portion of each of the connection pads 130b.

In some embodiments, the semiconductor substrate 130s include a silicon substrate including active components (e.g., transistors and/or memories, such as N-type metal-oxide semiconductor (NMOS) and/or P-type metal-oxide semiconductor (PMOS) devices, or the like) and/or passive components (e.g., resistors, capacitors, inductors or the like) formed therein. Such active components and passive components may be formed in a front-end-of-line (FEOL) process. For example, the semiconductor substrate 130s is a bulk silicon substrate, such as a bulk substrate of monocrystalline silicon, a doped silicon substrate, an undoped silicon substrate, or a silicon-on-insulator (SOI) substrate, where the dopant of the doped silicon substrate may be an N-type dopant, a P-type dopant or a combination thereof. The disclosure is not limited thereto.

In addition, the semiconductor substrate 130s may further include an interconnect structure (not shown) disposed on the active surface 130a. In certain embodiments, the interconnect structure may include one or more inter-dielectric layers and one or more patterned conductive layers stacked alternately for providing routing function to the active components and the passive components embedded in the semiconductor substrate 130s. In the disclosure, for example, the connection pads 130b may be referred to as an outermost layer (away from the active surface 130a) of the patterned conductive layers of the interconnect structure. The interconnect structure may be formed in a back-end-of-line (BEOL) process. For example, the inter-dielectric layers are silicon oxide layers, silicon nitride layers, silicon oxy-nitride layers, or dielectric layers formed by other suitable dielectric materials, and are formed by deposition or the like. For example, the patterned conductive layers are patterned copper layers or other suitable patterned metal layers, and are formed by electroplating or deposition. However, the disclosure is not limited thereto.

In some embodiments, the connection pads 130b are aluminum pads or other suitable metal pads. The connection vias 130d are copper pillars, copper alloy pillar or other suitable metal pillars containing copper metal, for example. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc. In addition, as shown in FIG. 8 (a plane view on a X-Y plane), for example, the connection vias 130d has the circular-shape in the cross-section on the X-Y plane. However, the cross-sectional shape of the connection vias 130d on the X-Y plane may be not limited to be the circular-shape, and may be elliptical, oval, tetragonal, octagonal or any suitable polygonal shape. As illustrated in FIG. 1 and FIG. 8, on the X-Y plane, the connection vias 130d each are physically separated and distant from each other through the protection layer 130e.

In some embodiments, the passivation layer 130c and the protection layer 130e may be a PBO layer, a PI layer or other suitable polymers. Alternatively, the passivation layer 130c and the protection layer 130e may be made of inorganic materials, such as silicon oxide, silicon nitride, silicon oxynitride, or any suitable dielectric material. The material of the passivation layer 130c can be the same or different from the material of the protection layer 130e, for example.

It is noted that, the semiconductor die 130 described herein is referred as a semiconductor chip or an integrated circuit (IC), for example. In an alternative embodiment, the semiconductor die 130 described herein may be a semiconductor device. In some embodiments, the semiconductor die 130 includes a digital chip, an analog chip or a mixed signal chip, such as an application-specific integrated circuit ("ASIC") chip, a sensor chip, a wireless and radio frequency (RF) chip, a memory chip, a logic chip or a voltage regulator chip. The logic chip may include a central processing unit (CPU), graphics processing unit (GPU), system-on-a-chip (SoC), microcontroller, or the like. The memory chip may include a memory chip or device, such as a dynamic random-access memory (DRAM) die, static random-access memory (SRAM) die, hybrid memory cube (HMC) module, a high bandwidth memory (HBM) module, or the like. The sensor chip may include a photo/image sensor chip or the like. The disclosure is not limited thereto.

In addition to the semiconductor die 130, additional semiconductor die(s) of the same type or different types may be further disposed on the buffer layer 116 and electrically connected/communicated to the semiconductor die 130 through later-formed connector(s) (e.g., a redistribution circuit layer), in other embodiments. For example, the additional semiconductor die(s) include digital chips, analog chips or mixed signal chips, such as ASIC chips, sensor chips, wireless and RF chips, memory chips, logic chips or voltage regulator chips. The disclosure is not limited thereto. In alternative embodiments, the additional semiconductor die(s) may independently be referred to as a chip or an IC of combination-type, such as a WiFi chip simultaneously including both of a RF chip and a digital chip.

Continued on FIG. 1, in some embodiments, the semiconductor die 130 further includes a sensor device 120 located on the active surface 130*a* of the semiconductor substrate 130*s*, where the sensor device 120 is further embedded in the semiconductor substrate 130*s*. For example, the semiconductor substrate 130*s* of the semiconductor die 130 has a first region 101 and a second region 102 adjacent next to the first region 101, where the sensor device 120 is located in the semiconductor substrate 130*s* within the first region 101, and the connection pads 130*b* and the connection vias 130*d* are located on the semiconductor substrate 130*s* over the second region 102. In FIG. 1 and FIG. 8, the connection pads 130*b* and the connection vias 130*d* are not located over the first region 101 but the second region 102, while the sensor device 120 is located over the first region 101, in some embodiments. That is, on the X-Y plane as shown in FIG. 8, the connection pads 130*b* and the connection vias 130*d* are arranged aside of the sensor device 120, for example. In the disclosure, the first region 101 may be referred to as a sensor region, and the second region 102 may be referred to as a device/circuit region. The first region 101 is surrounded by the second region 102, as shown in FIG. 8, in some embodiments.

In some embodiments, in the semiconductor substrate 130*s*, the sensor device 120 is electrically connected/communicated to the active components and/or the passive components through the interconnect structure. On the other hand, the sensor device 120 may be electrically connected and communicated to the additional semiconductor die(s) through the interconnect structure and the connection vis 130*d* of the semiconductor substrate 130*s* and later-formed connectors. For example, the sensor device 120 is configurated to convert light signals (photons) from a light source to electrical signals, where the electrically signals are transmitted to the active components and/or the passive components (and/or further to the additional semiconductor dies) for processing. In some embodiments, peripheral circuits (not shown) used for processing of the electrical signals from the sensor device 120 may be formed in the semiconductor substrate 130*s* of the semiconductor die 130 (and/or the additional semiconductor die, if any). The peripheral circuits may include image signal processing (ISP) circuits which including analog-to-digital converters (ADCs), correlated double sampling (CDS) circuits, row decoders and the like. For example, the peripheral circuits may be part of the active components and/or the passive components, or a component separated from and electrically connected to the active components and/or the passive components of the semiconductor die 130 (and/or the additional semiconductor die, if any), the disclosure is not limited thereto.

The sensor device 120 may include an image sensor, such as a photo-sensitive metal-oxide-semiconductor (MOS) transistor or a photo-sensitive diode. For example, the sensor device 120 include a photo-sensitive diode (or saying photo diode). However, the disclosure is not limited there, and in an alternative embodiment, the sensor device 120 may be an image sensor of other types. For example, only one sensor device 120 is shown for illustrative purposes, however the number of the sensor device 120 is not limited thereto. The number of the sensor device 120 may be one or more than one based on the demand and design layout. In the embodiments of which multiple sensor devices 120 are included, the sensor devices 120 may be arranged into a M*N array on the X-Y plane, where one of M and N is a positive integer greater than or equal to one and other one of M and N is a positive integer greater than or equal to two. For example, the direction X and the direction Y are perpendicular to the stacking direction Z, where the direction Y is different from the direction X. In the embodiments of which multiple sensor device 120 are included, the sensor device 120, in part or all, may be electrically connected in parallel or in series. For example, due to the sensor device 120, the semiconductor die 130 depicted in FIG. 1 is referred to as a sensor chip while the sensor device 120 is the photo-sensitive diode. In the disclosure, it should be appreciated that the illustration of the carrier 112, the debond layer 114, the buffer layer 116, the semiconductor die 130, the sensor device 120 and other components (later-formed) throughout all figures is schematic and is not in scale.

In some embodiments, as shown in FIG. 1, the semiconductor die 130 is disposed on the buffer layer 116 with a connecting film DA. In other words, the backside surface 130*f* of the semiconductor die 130 is adhered to a surface S1 of the buffer layer 116 by the connecting film DA. The connecting film DA is sandwiched between the backside surface 130*f* of the semiconductor die 130 and the surface S1 of the buffer layer 116, for example. Owing to the connecting film DA, the semiconductor die 130 is stably adhered to the buffer layer 116. In some embodiments, the connecting film DA may be, but not limited to, a die attach film or a layer made of adhesives, epoxy-based resin, acrylic polymer, other suitable insulating material, or the like, and which may be with or without fillers filled therein (such as silica, alumina, or the like).

However, the disclosure is not limited thereto. In alternative embodiments, the buffer layer 116 may be omitted, the semiconductor die 130 is then disposed on the debond layer 114 through the connecting film DA. In further alternative embodiments, the connecting film DA may be omitted, the semiconductor die 130 is then disposed on the debond layer 114 through the buffer layer 116. That is, in the embodiments of which the connecting film DA is omitted, the buffer layer 116 includes a die attach film or layer.

Figure 2:
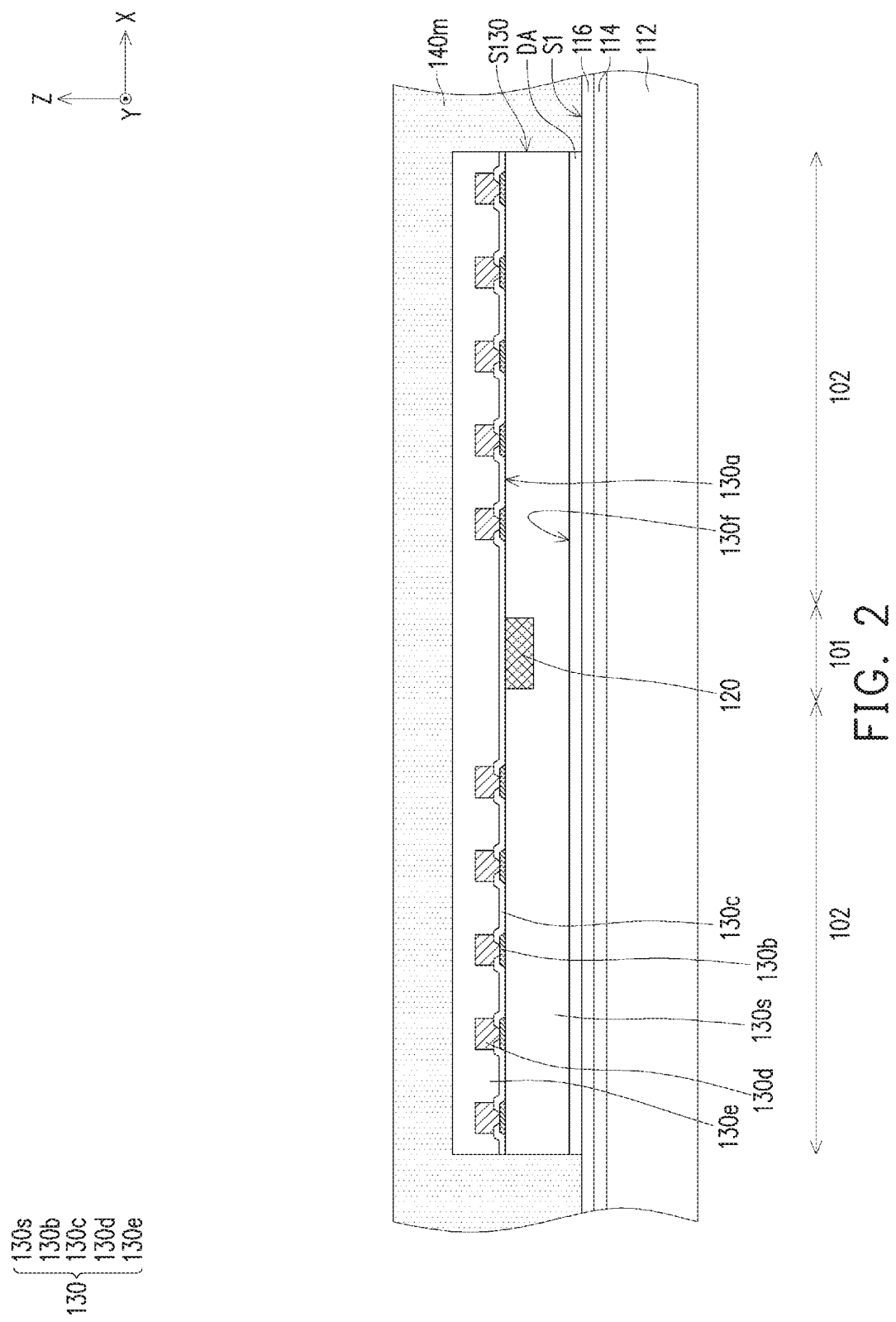

Referring to FIG. 2, in some embodiments, the semiconductor die 130 is encapsulated in an insulating encapsulation 140m. For example, the insulating encapsulation 140m is formed on the buffer layer 116 and over the carrier 112 to at least cover a sidewall S130 of the semiconductor die 130, a sidewall of the connecting film DA and the surface S1 of the buffer layer 116 exposed by the semiconductor die 130 and the connecting film DA. In some embodiments, a thickness of the insulating encapsulation 140m is greater than a thickness of the semiconductor die 130. In other words, for example, the semiconductor die 130 is not accessibly revealed by and embedded in the insulating encapsulation 140m.

In the disclosure, the insulating encapsulation 140m is made of a material capable of blocking infrared (IR). The material of the insulating encapsulation 140m may be a molding compound formed by a molding process. The material of the insulating encapsulation 140m may include polymers (such as epoxy resins, phenolic resins, silicon-containing resins, or other suitable resins), dielectric materials, or other suitable materials. Alternatively, the insulating encapsulation 140m may include an acceptable insulating encapsulation material. In addition, for example, the insulating encapsulation 140m further includes inorganic filler or inorganic compound (e.g., silica, clay, and so on) which can be added therein to optimize coefficient of thermal expansion (CTE) of the insulating encapsulation 140m. The disclosure is not limited thereto.

Figure 3:
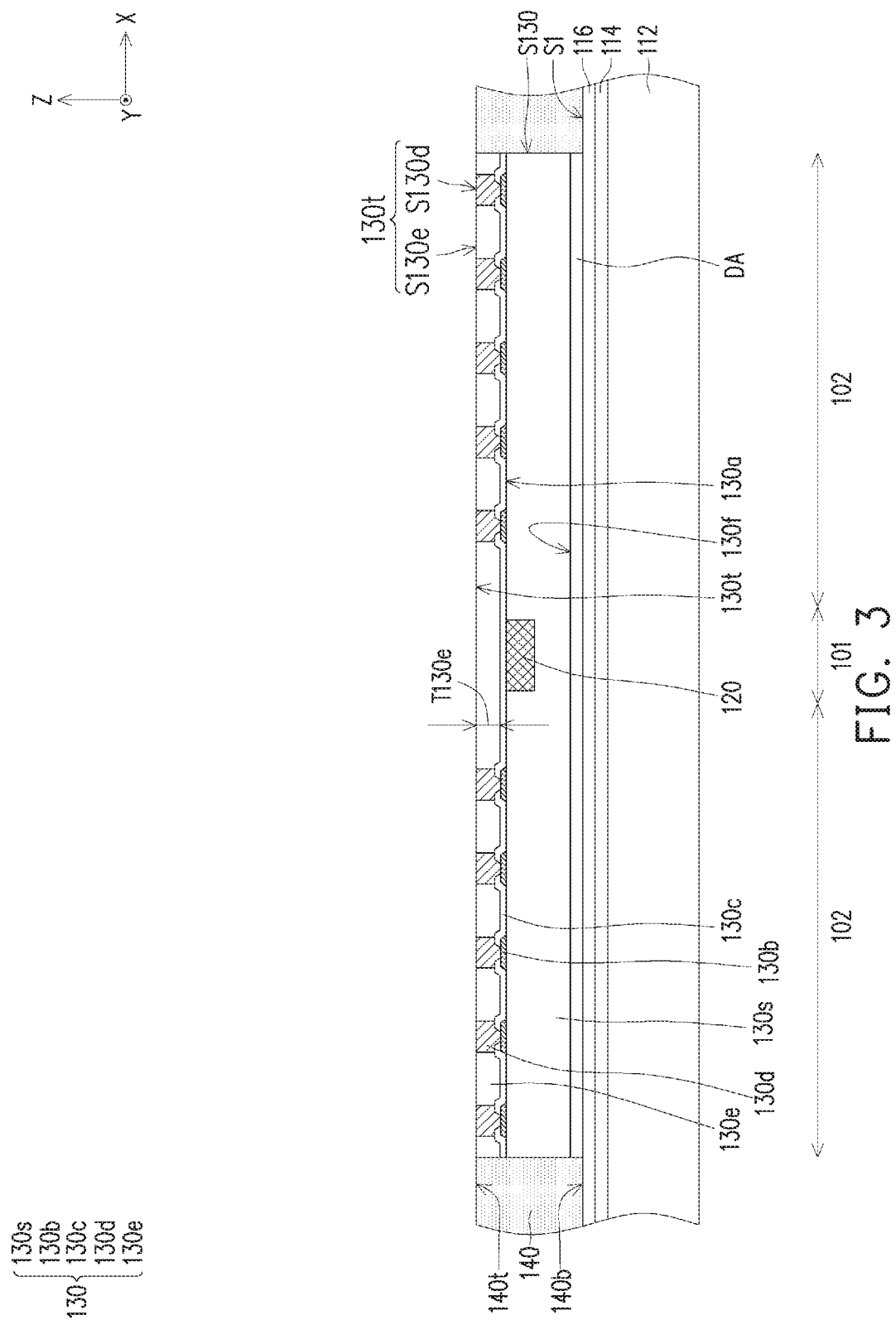

Referring to FIG. 3, in some embodiments, the insulating encapsulation 140m is planarized to form an insulating encapsulation 140 exposing the semiconductor die 130. In certain embodiments, as shown in FIG. 3, after planarizing, a top surface 130t of the semiconductor die 130 (e.g., constituted by top surfaces S130d of the connection vias 130d and a top surface S130e of the protection layer 130e) is exposed by a top surface 140t of the insulating encapsulation 140. That is, the top surface 130t of the semiconductor die 130 become substantially leveled with the top surface 140t of the insulating encapsulation 140. For example, the top surface 130t of the semiconductor die 130 and the top surface 140t of the insulating encapsulation 140 are substantially coplanar to each other. As shown in FIG. 3, the top surface 130t is connected to the bottom surface 130f through the sidewall S130, for example. In some embodiments, as shown in FIG. 3, the semiconductor die 130 is accessibly revealed by the insulating encapsulation 140. That is, the connection vias 130d of the semiconductor die 130 are accessibly revealed by the insulating encapsulation 140. On the other hand, for example, a bottom surface 140b (opposing to the top surface 140t) of the insulating encapsulation 140 is substantially leveled with and substantially coplanar to a bottom surface of the connecting film DA facing away from the semiconductor die 130, as shown in FIG. 3.

The insulating encapsulation 140m may be planarized by mechanical grinding or chemical mechanical polishing (CMP), for example. After the planarizing step, a cleaning step may be optionally performed, for example to clean and remove the residue generated from the planarizing step. However, the disclosure is not limited thereto, and the planarizing step may be performed through any other suitable method. In some embodiments, during planarizing the insulating encapsulation 140m, the connection vias 130d and the protection layer 130e of the semiconductor die 130 may also be planarized. In certain embodiments, the planarizing step may be, for example, performed on the over-molded insulating encapsulation 140m to level the top surface 140t of the insulating encapsulation 140 and the top surface 130t (e.g., the top surfaces S130d of the connection vias 130d and the top surface S130e of the protection layer 130e) of the semiconductor die 130. As shown in FIG. 3, for example, after planarizing, a thickness T130e of the protection layer 130e is approximately ranging from 3 μm to 25 μm.

Figure 4:
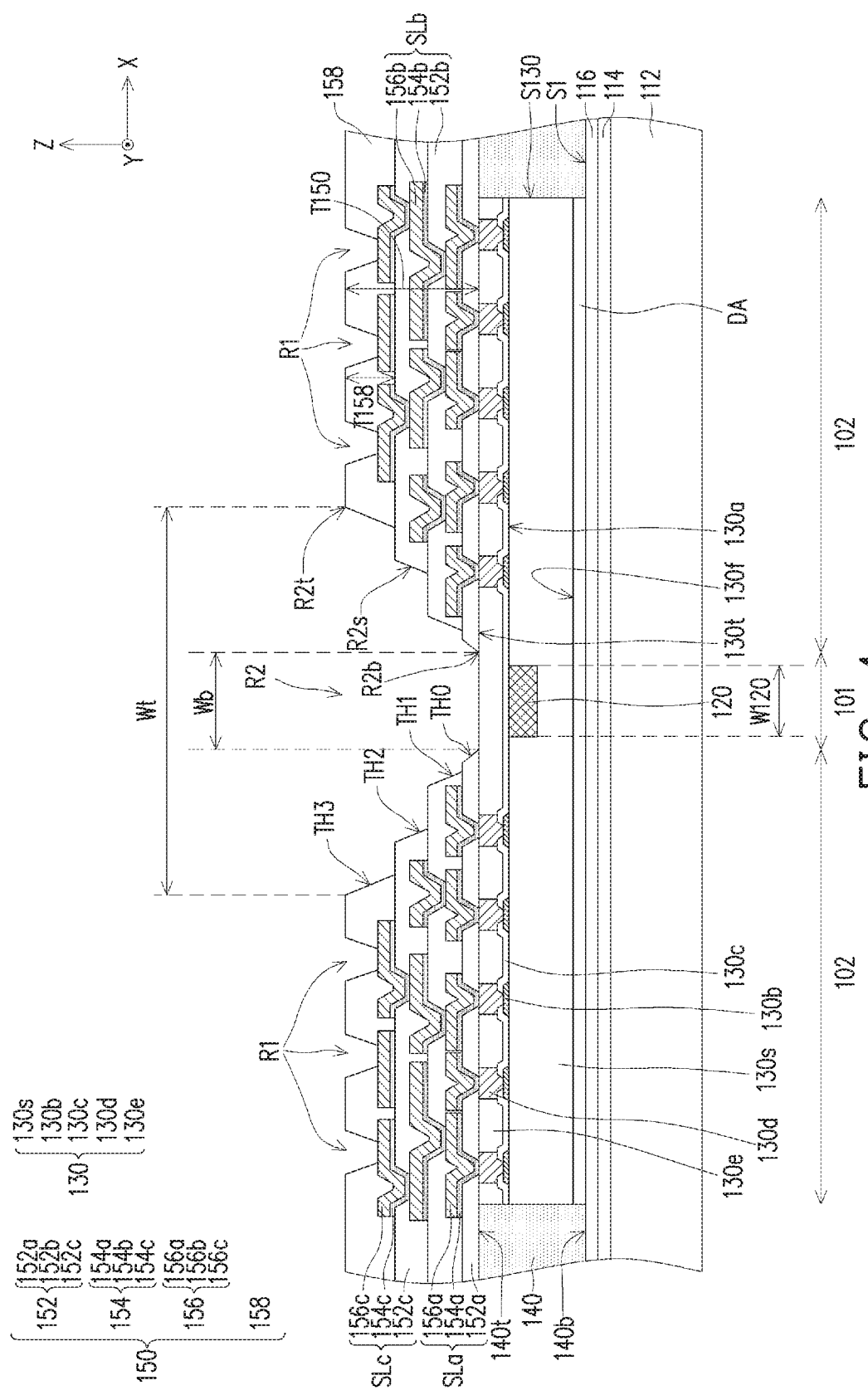

Referring to FIG. 4, in some embodiments, a redistribution circuit structure 150 is formed on the semiconductor die 130 and the insulating encapsulation 140. For example, as shown in FIG. 4, the redistribution circuit structure 150 includes one or more than one dielectric layer 152 (e.g., a dielectric layer 152a, a dielectric layer 152b and a dielectric layer 152c), one or more than one seed layer 154 (e.g., a seed layer 154a, a seed layer 154b and a seed layer 154c), one or more than one patterned conductive layer 156 (e.g., a patterned conductive layer 156a, one or more than one patterned conductive layer 156b and a patterned conductive layer 156c) and a dielectric layer 158. However, the number of each of the dielectric layer 152, the seed layer 154 and the patterned conductive layer 156 may not be limited to what is depicted in FIG. 4, and may be selected or designated based on the demand and/or design layout. In other words, with the presence of the dielectric layer 158, the number of each of the dielectric layer 152, the seed layer 154 and the patterned conductive layer 156 may be zero (see FIG. 12 and FIG. 14), one (see FIG. 10), two, three (see FIG. 7 and FIG. 9), or more; the disclosure is not limited thereto.

In some embodiments, one dielectric layer 152, one seed layer 154 and one patterned conductive layer 156 are sequentially formed between the insulating encapsulation 140 and the dielectric layer 158 along the stacking direction Z in a repeating manner. For example, the dielectric layer 152a is formed on the insulating encapsulation 140 and the semiconductor die 130. The dielectric layer 152a may be formed by, but not limited to, forming a blanket layer of dielectric material (not shown) over the structure depicted in FIG. 3 to completely cover the insulating encapsulation 140 and the semiconductor die 130, and patterning the dielectric material blanket layer to form the dielectric layer 152a. In some embodiments, during patterning the dielectric material blanket layer to form the dielectric layer 152a, a plurality of recesses (not labeled) and a trench TH0 are formed in the dielectric material blanket layer to form the dielectric layer 152a. In some embodiments, the recesses formed in the dielectric layer 152a are over the second region 102 and overlapped with the connection vias 130d of the semiconductor die 130, and the trench TH0 formed in the dielectric layer 152a is over the first region 101 and overlapped with the sensor device 120. As shown in FIG. 4, for example, the connection vias 130d of the semiconductor die 130 are accessibly revealed by the recesses formed in the dielectric layer 152a, respectively.

The material of the dielectric layer 152a may be PI, PBO, BCB, a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. The dielectric layer 152a may be formed by suitable fabrication techniques such as spin-on coating, chemical vapor deposition (CVD), (e.g. plasma-enhanced chemical vapor deposition (PECVD)), or the like. As shown in FIG. 4, for example, the dielectric layer 152a is located on the top surface 140t of the insulating encapsulation 140 and the top surface 130t of the semiconductor die 130, where the top surfaces S130d of the connection vias 130d of the semiconductor die 130 are at least partially exposed by the recesses formed in the dielectric layer 152a.

In some embodiments, after forming the dielectric layer 152a, a seed layer material (not shown) is conformally formed over the dielectric layer 152a. In some embodiments, the seed layer material is formed on the dielectric layer 152a and extends into the recesses and the trench TH0 formed in the dielectric layer 152a to physically contact the connection vias 130d of the semiconductor die 130 exposed by the recesses, the protection layer 130e of the semiconductor die 130 exposed by the trench TH0 and portions of the dielectric layer 152a (e.g. sidewalls of the recesses and the trench TH0). In other words, the seed layer material penetrates through the dielectric layer 152a, and the sidewalls and bottom surfaces of the recesses and the trench TH0 formed in the dielectric layer 152a are completely covered by the seed layer material.

For example, the seed layer material is formed over the dielectric layer 152a in a manner of a blanket layer made of metal or metal alloy materials. The seed layer material may be referred to as a metal layer including a single layer or a composite layer including a plurality of sub-layers formed of different materials. In some embodiments, the seed layer material includes titanium, copper, molybdenum, tungsten, titanium nitride, titanium tungsten, combinations thereof, or the like. For example, the seed layer material may include a titanium layer and a copper layer over the titanium layer. The seed layer material may be formed using, for example, sputtering, physical vapor deposition (PVD), or the like. In some embodiments, the seed layer material may be conformally formed on the dielectric layer 152a by sputtering, and in contact with the connection vias 130d and the protection layer 130e exposed by the recesses and the protection layer 130e of the semiconductor die 130 exposed by the trench TH0 formed in the dielectric layer 152a. In some embodiments, the seed layer material is electrically connected to the semiconductor die 130 via physically connecting the connection vias 130d accessibly revealed by the dielectric layer 152a through the recesses.

In some embodiments, the patterned conductive layer 156a is formed on the seed layer material, and then the seed layer 154a is formed, via a patterning process, by using the patterned conductive layer 156a as etching mask. In some embodiments, the patterned conductive layer 156a may be formed by, but not limited to, forming a patterned photoresist layer (not shown) on the seed layer material, where the patterned photoresist layer has a plurality of recesses (not shown) exposing portions of the seed layer material (each overlapping with the underlying connection vias 130d); and filling a conductive material into the recesses formed in the patterned photoresistor layer to form the patterned conductive layer 156a. With such, the patterned conductive layer 156a may include a plurality of conductive patterns or segments. The patterned photoresist layer may be formed by coating and photolithography processes or the like, and the number of the recesses may correspond to the number of later-formed conductive structure(s) (such as the conductive patterns or segments included in the patterned conductive layer 156a). In some embodiments, a material of the patterned photoresist layer, for example, includes a positive resist material or a negative resist material, that is suitable for a patterning process such as a photolithography process with a mask or a mask-less photolithography process (for instance, an electron-beam (e-beam) writing or an ion-beam writing). However, the disclosure is not limited thereto.

After the patterned conductive layer 156a is formed, the patterned photoresist layer is removed, for example. The patterned photoresist layer may be removed by acceptable ashing process and/or photoresist stripping process, such as using an oxygen plasma or the like. The disclosure is not limited thereto. In some embodiments, the patterned conductive layer 156a is electrically connected to the seed layer material through physical connection therebetween. The patterned conductive layer 156a may be made of conductive materials formed by electroplating, such as copper, copper alloy, aluminum, aluminum alloy, or combinations thereof. In some embodiments, the patterned conductive layer 156a may be patterned copper layers or other suitable patterned metal layers.

In some embodiments, after the formation of the patterned conductive layer 156a, portions of the seed layer material exposed by the patterned conductive layer 156a are removed to form the seed layer 154a. The seed layer material is etched to form the seed layer 154a by using the patterned conductive layer 156a as an etching mask, for example. The etching process may include a dry etching process, a wet etching process, or a combination thereof. As shown in FIG. 4, the seed layer 154a includes one or more conductive segments which are mechanically and electrically isolated from one another, for example. In certain embodiments, the seed layer 154a includes one or more conductive segments each electrically connected to an underlying one of the connection vias 130d of the semiconductor die 130 and an overlying one of the conductive patterns/segments of the patterned conductive layer 156a, as shown in FIG. 4. In some embodiments, sidewalls of the seed layer 154a are substantially aligned with sidewalls of the respective one conductive pattern/segment of the patterned conductive layer 156a.

However, the disclosure is not limited thereto. Alternatively, a conductive material may be conformally formed over the seed layer material by electroplating or deposition, and then the conductive material and the seed layer material may be patterned to form the patterned conductive layer 156a and the seed layer 154a. In one embodiment, the patterned conductive layer 156a and the seed layer 154a are formed in a same patterning step. In another embodiment, the patterned conductive layer 156a and the seed layer 154a are formed in different patterning steps. The patterning steps may be performed by photolithography and etching processes. In the disclosure, the dielectric layer 152a, the seed layer 154a, the patterned conductive layer 156a together may be referred to as a first build-up layer SLa of the redistribution circuit structure 150. For example, the first build-up layer SLa has a high degree of coplanarity to facilitate a formation of the later-formed feature (such as a layer (e.g., an additional build-up layer or a single-layer) or element (e.g., a semiconductor die or chip)).

As illustrated in FIG. 4, in some embodiments, through the seed layer 154a, the patterned conductive layer 156a is electrically connected to the connection vias 130d. Thereafter, the dielectric layer 152b, the seed layer 154b, the patterned conductive layer 156b, the dielectric layer 152c, the seed layer 154c and the patterned conductive layer 156c are sequentially formed on the first build-up layer SLa, for example. In some embodiments, the patterned conductive layer 156b is electrically connected to the patterned conductive layer 156a through the seed layer 154b, and the patterned conductive layer 156c is electrically connected to the patterned conductive layer 156b through the seed layer 154c. The dielectric layer 152b, the seed layer 154b, the patterned conductive layer 156b together may be referred to as a second build-up layer SLb of the redistribution circuit structure 150, and the dielectric layer 152c, the seed layer 154c, the patterned conductive layer 156c together may be referred to as a third build-up layer SLc of the redistribution circuit structure 150. In other words, for example, the first build-up layer SLa, the second build-up layer SLb and the third build-up layer SLc are electrically connected to one another. In addition, the seed layer 154a and the patterned conductive layer 156a, the seed layer 154b and the patterned conductive layer 156b, and the seed layer 154c and the patterned conductive layer 156c may be respectively paired, where the paired-layers each may be referred to as a metallization layer of the redistribution circuit structure 150. In some embodiments, as shown in FIG. 4, the trench TH0 formed in the dielectric layer 152a of the first build-up layer SLa is exposed by a trench TH1 formed in the dielectric layer 152b of the second build-up layer SLb, the trench TH1 is exposed by a trench TH2 formed in the dielectric layer 152c of the third build-up layer SLc. The trenches TH0, TH1 and TH2 are over the first region 101 and overlapped with the sensor device 120, for example.

In some embodiments, after forming the patterned conductive layer 156c, the dielectric layer 158 is formed on the patterned conductive layer 156c. For example, portions of the patterned conductive layer 156c are exposed by a plurality of recesses R1 formed in the dielectric layer 158 (over the second region 102) for electrical connecting later-formed connectors (e.g. conductive terminals or conductive balls). In some embodiments, during the formation of the recesses R1, a trench TH3 is formed in the dielectric layer 158 over the first region 101 and overlapped with the sensor device 120. The dielectric layer 158 may serve as a passivation layer for providing a high degree of coplanarity to facilitate a formation of the later-formed feature or element. For example, a thickness T158 of the dielectric layer 158 is approximately ranging from 2 μm to 15 μm. Up to here, the redistribution circuit structure 150 is formed, where the redistribution circuit structure 150 is referred to as a front-side redistribution layer of the semiconductor die 130 and provides routing function to the semiconductor die 130. The number of the build-up layers included in the redistribution circuit structure 150 is not limited in the disclosure. In one embodiment, the number of the build-up layers included in the redistribution circuit structure 150 may be one or more than one (see FIG. 7, FIG. 9 and FIG. 10), or zero (see FIG. 12 and FIG. 14). As shown in FIG. 4, for example, the redistribution circuit structure 150 is electrically connected to the connection vias 130d of the semiconductor die 130 laterally encapsulated by the insulating encapsulation 140.

In some embodiments, the trenches TH0, TH1, TH2 and TH3 respectively formed in the dielectric layers 152a-152c and 158 are spatially communicated to each other, thereby together forming a recess R2 in the redistribution circuit structure 150 over the first region 101. The recess R2 is overlapped with the sensor device 120, for example. That is, the redistribution circuit structure 150 has a thickness (e.g., T150) over the second region 102 less than a thickness (not exist) over the first region 101. Due to the recess R2, an intensity of the light signals receiving by the sensor device 120 for processing is enhance. The formations and materials of the dielectric layers 152b, 152c and 158 may be the same or similar to the formation and material of the dielectric layer 152a, the formations and materials of the seed layers 154b and 154c may be the same or similar to the formation and material of the seed layer 154a, and the formations and materials of the patterned conductive layers 156b and 156c may be the same or similar to the formation and material of the patterned conductive layer 156a, and thus are not repeated herein for simplicity. For example, in FIG. 4, only six recesses R1 and only one recess R2 (e.g. one trench TH0, one trench TH1, one trench TH2 and one trench TH3) are shown, however the disclosure is not limited thereto. The number of each of the recesses R1 or recess R2 may be one or more than one depending on the demand and the design layout.

Continued on FIG. 4, for example, in a cross section on the X-Z plane, the trenches TH0-TH3 each have slant sidewalls, and the slant sidewalls are distant from each other with an offset along the direction X, for example. However, the disclosure is not limited thereto. The trenches TH0-TH3 each may have slant sidewalls, and the slant sidewalls may be connected. Alternatively, the trenches TH0-TH3 each may have vertical sidewalls, and the vertical sidewalls may be distant from each other with an offset along the direction X. Or, the trenches TH0-TH3 each may have vertical sidewalls, and the vertical sidewalls may be connected. In other words, for example, in a cross section of the recess R2, a sidewall R2s of the recess R2 is in a form of a substantially slant line, a substantially vertical line, a plurality of substantially slant lines and substantially horizontal lines interconnected in alternation (see FIG. 4), or a plurality of substantially vertical lines and substantially horizontal lines interconnected in alternation.

Referring to FIG. 4 and FIG. 8, in some embodiments, if considering the recess R2 is a hole with a substantially rectangular-shape in the cross-section on the X-Y plane (FIG. 8) and the slant sidewalls in the cross-section on the X-Z plane (FIG. 4), the recess R2 has a top opening R2t having a size Wt and a bottom opening R2b having a size Wb, where the size Wt is greater than the size Wb. However, in alternative embodiments, for the recess R2, the size Wt of the top opening R2t may be substantially equal to the size Wb of the bottom opening R2b. In some embodiments, the size Wb of the bottom opening R2b of the recess R2 is greater than a size W120 of the sensor device 120, see FIG. 4 and FIG. 8. That is, the size of the recess R2 may greater than the size of the sensor device 120. In alternative embodiments, the size Wb of the bottom opening R2b of the recess R2 may be equal to the size W120 of the sensor device 120. That is, the size of the recess R2 may be substantially equal to the size of the sensor device 120. In the disclosure, the size Wt may be greater than or substantially equal to the size Wb, the size Wt may be greater than or substantially equal to the size W120, and the size Wb may be greater than or substantially equal to the size W120. For example, a perimeter of the bottom opening R2b of the recess R2 surrounds a perimeter of the sensor device 120, where a distance D is between the perimeter of the bottom opening R2b and the perimeter of the sensor device 120, as shown in FIG. 8. The distance D may be approximately ranging from 0 μm to 120 μm. In other words, if considering the distance D is greater than 0 μm and greater than or substantially equals to 120 μm, the perimeter of the bottom opening R2b may be aside of and enclose the perimeter of the sensor device 120. Alternatively, if considering the distance D substantially equals to 0 μm, the perimeter of the bottom opening R2b of the recess R2 may be substantially aligned to the perimeter of the sensor device 120, where the perimeter of the bottom opening R2b of the recess R2 may be substantially overlapped with the perimeter of the sensor device 120. In addition, the recess R2 may be not limited to be the rectangular-shape in the cross-section on the X-Y plane, and may be round, elliptical, oval, tetragonal, octagonal or any suitable polygonal shape.

An additional dielectric layer (not shown) may be present between two adjacent dielectric layers 152a-152c and 158 along the direction Z. The additional dielectric layer(s) may be silicon nitride and used for etching stop layers, while the dielectric layers 152a-152c and 158 may be silicon oxide and used for bonding. The forming process of the additional dielectric layer(s) is the same to the formation of the dielectric layers 152a-152c and 158, and thus are not repeated herein for brevity. Due to the etching rate of the additional dielectric layer(s) and the etching rate of the dielectric layers 152a-152c and 158 is significantly different, the etching processes of the additional dielectric layer(s) is performed without removal of the dielectric layers 152a-152c and 158 (e.g. the removal of the dielectric layers 152a-152c and 158 is significantly small and thus is negligible), for example; and vice versa.

Figure 5:
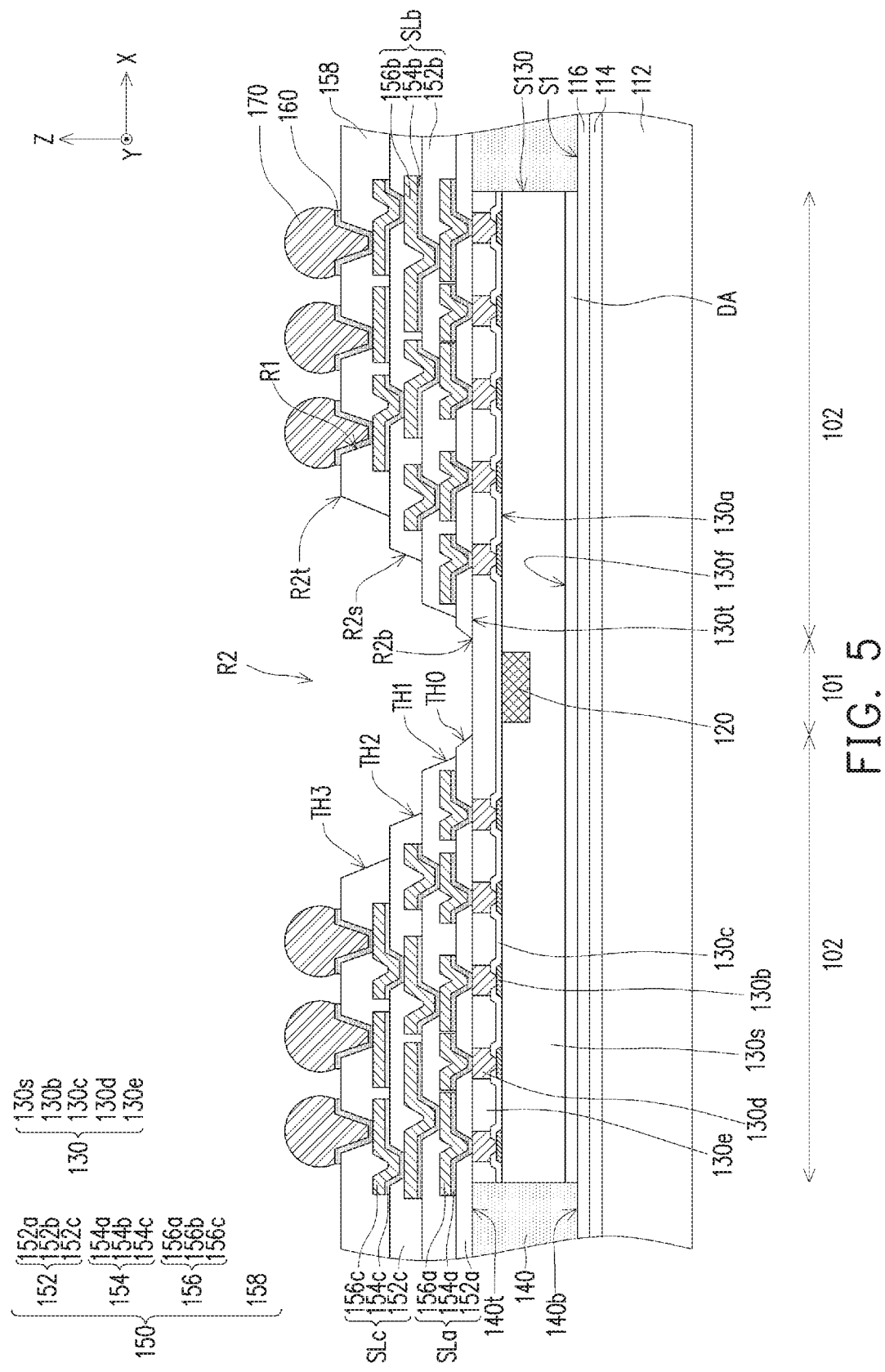

Referring to FIG. 5, in some embodiments, a plurality of under-ball metallurgy (UBM) patterns 160 and a plurality of conductive elements 170 are sequentially formed over the redistribution circuit structure 150. In some embodiments, the UBM patterns 160 each are located between a respective one of the conductive elements 170 and the dielectric layer 158 of the redistribution circuit structure 150, where the UBM patterns 160 extend into the recesses R1 formed in the dielectric layer 158 to physically contact the portions of the patterned conductive layer 156c exposed by the recesses R1. Due to the UBM patterns 160, the adhesive strength between the conductive elements 170 and the redistribution circuit structure 150 is enhanced. As shown in FIG. 5, the UBM patterns 160 and the conductive elements 170 are formed over the second region 102 and aside of the sensor device 120 located within the first region 101.

In some embodiments, the UBM patterns 160 are located on the portions of the patterned conductive layer 156c exposed by the recesses R1 formed in the dielectric layer 158. As shown in FIG. 5, in some embodiments, the UBM patterns 160 are electrically connected to the redistribution circuit structure 150, and the conductive elements 170 are electrically connected to the redistribution circuit structure 150 through the UBM patterns 160. In some embodiments, the conductive elements 170 are electrically connected to the semiconductor die 130 through the redistribution circuit structure 150 and the UBM patterns 160. In some embodiments, the UBM patterns 160 are made of a metal layer including a single layer or a metallization layer including a composite layer with a plurality of sub-layers formed of different materials. In some embodiments, the UBM patterns 160 include copper, nickel, molybdenum, titanium, tungsten, titanium nitride, titanium tungsten, combinations thereof, or the like. For example, the UBM patterns 160 may include a titanium layer and a copper layer over the titanium layer. The UBM patterns 160 may be formed using, for example, electroplating, sputtering, physical vapor deposition (PVD), or the like. In some embodiments, the UBM patterns 160 may be conformally formed on the dielectric layer 158 by sputtering, and in contact with the patterned conductive layer 156c exposed by the recesses R1. In some embodiments, the UBM patterns 160 is electrically connected to the redistribution circuit structure 150 via physically connecting the patterned conductive layer 156c accessibly revealed by the recesses R1 formed in the dielectric layer 158. The number of the UBM patterns 160 may not be limited in this disclosure, and may correspond to the number of the portions of the patterned conductive layer 156c exposed by the recesses R1 formed in the dielectric layers 158.

In some embodiments, the conductive elements 170 are disposed on the UBM patterns 160 by ball placement process or reflow process. The conductive elements 170 are, for example, solder balls or ball grid array (BGA) balls or bumps. Alternatively, the conductive elements 170 may include micro-bumps, metal pillars, electroless nickel-electroless palladium-immersion gold (ENEPIG) formed bumps, controlled collapse chip connection (C4) bumps, or the like; and may be formed by plating. The conductive elements 170 may be solder free. The number of the conductive elements 170 may not be limited to the disclosure, and may be designated and selected based on the number of the UBM patterns 160.

However, the disclosure is not limited thereto. In some alternative embodiments, the UBM patterns 160 may be omitted (e.g., a package structure P1' of FIG. 9). In the package structure P1' shown in FIG. 9, the conductive elements 170 may be directly connected to the redistribution circuit structure 150 (e.g. the portions of the patterned conductive layer 156c exposed by the recesses R1). The conductive elements 170 may be referred to as conductive terminals, in the disclosure.

In some embodiments, as shown in FIG. 5 and FIG. 8, on the X-Y plane, the conductive elements 170 are disposed inside a positioning location of the semiconductor die 130. Alternatively, on the X-Y plane, some of the conductive elements 170 may be disposed inside a positioning location of the semiconductor die 130, and some of the conductive elements 170 may be disposed inside a positioning location of the insulating encapsulation 140. The disclosure is not limited thereto.

Figure 6:
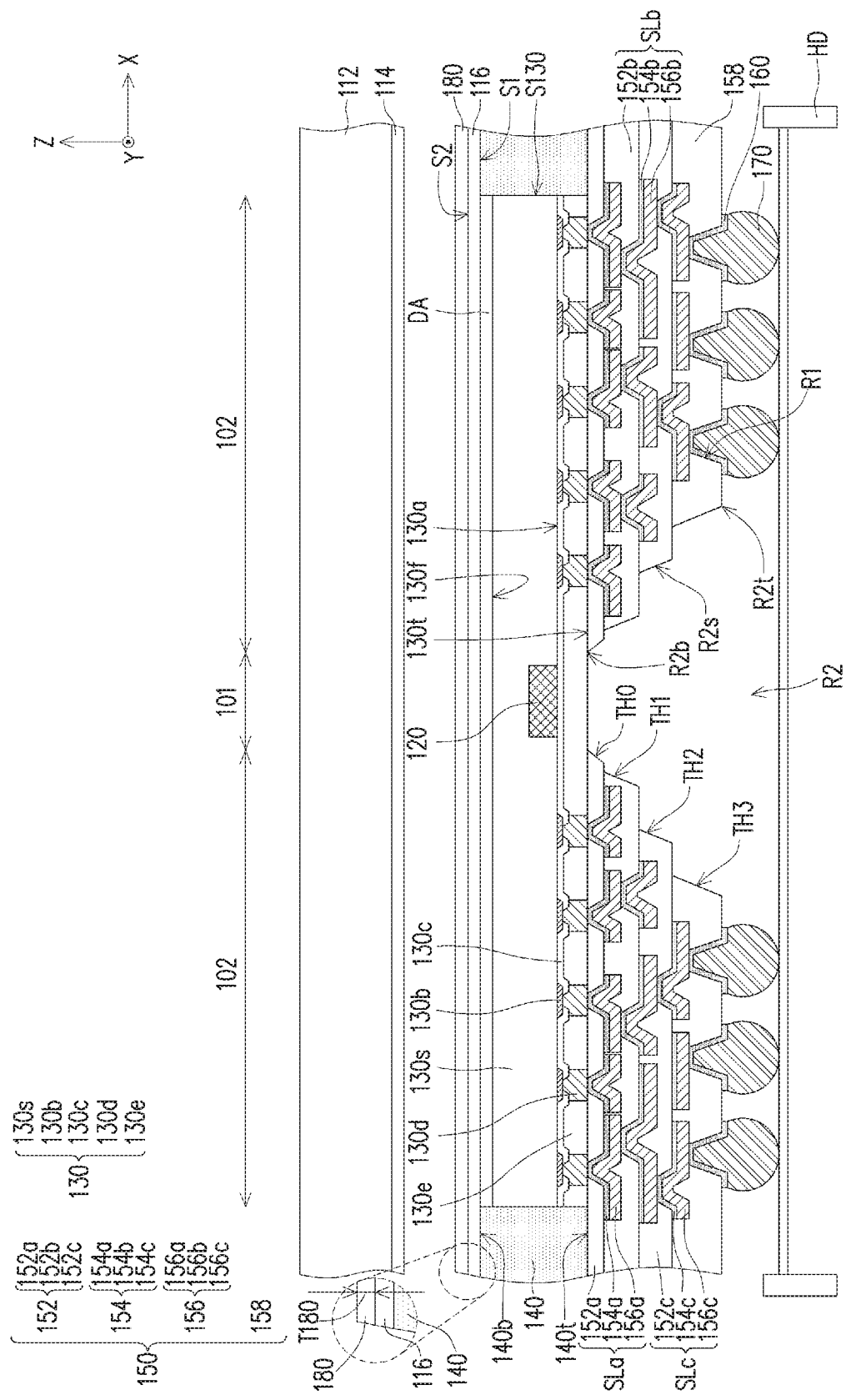

Referring to FIG. 6, in some embodiments, the whole structure depicted in FIG. 5 along with the carrier 112 is flipped (turned upside down), where the conductive elements 170 are placed to a holding device HD, and the carrier 112 is then debonded from the buffer layer 116. In some embodiments, the holding device HD may be an adhesive tape, a carrier film or a suction pad. The disclosure is not limited thereto.

In some embodiments, the buffer layer 116 is easily separated from the carrier 112 due to the debond layer 114. In some embodiments, the carrier 112 is detached from the buffer layer 116 through a debonding process, and the carrier 112 and the debond layer 114 are removed, where a surface S2 of the buffer layer 116 is exposed. In one embodiment, the debonding process is a laser debonding process. During the debonding step, the holding device HD is used to secure the whole structure depicted in FIG. 5 before debonding the carrier 112 and the debond layer 114.

Continued on FIG. 6, in some embodiments, a protection layer 180 is formed on the buffer layer 116 and over the semiconductor die 130. For example, the protection layer 180 is in contact with the surface S2 of the buffer layer 116. In other words, the buffer layer 116 is located between the connecting film DA and the protection layer 180 and between the insulating encapsulation 140 and the protection layer 180. In the disclosure, the protection layer 180 is made of a dielectric material capable of blocking infrared (IR), where the dielectric layer is referred to as an IR blocking layer. In some embodiments, a thickness T180 of the protection layer 180 is approximately ranging from 5 μm to 50 μm. For example, the protection layer 180 is a lamination compound (LC) tape which is formed on the buffer layer 116 by lamination. In other embodiments, the protection layer 180 may be an Ajinomoto buildup film (ABF), a solder resist film (SR), or the like. Alternatively, the protection layer 180 may be a polymer layer which made of polyimide (PI), polybenzoxazole (PBO), benzocyclobutene (BCB), or any other suitable polymer-based dielectric material. The protection layer 180 may be formed by a suitable fabrication technique such as spin-coating, lamination, deposition, or the like. However, the disclosure is not specifically limited thereto.

Alternatively, in the embodiments of which the buffer layer 116 is omitted, the protection layer 180 may be formed on the insulating encapsulation 140 and the connecting film DA and over the semiconductor die 130. The protection layer 180 may be in contact with the surface S2 of the insulating encapsulation 140 and the surface of the connecting film DA facing away the semiconductor die 130. In other words, the protection layer 180 may be disposed on the connecting film DA and the insulating encapsulation, where the connecting film DA is located between the semiconductor die 130 and the protection layer 180, and the insulating encapsulation 140 is located between the redistribution circuit structure 150 and the protection layer 180. The disclosure is not limited thereto.

Figure 7:
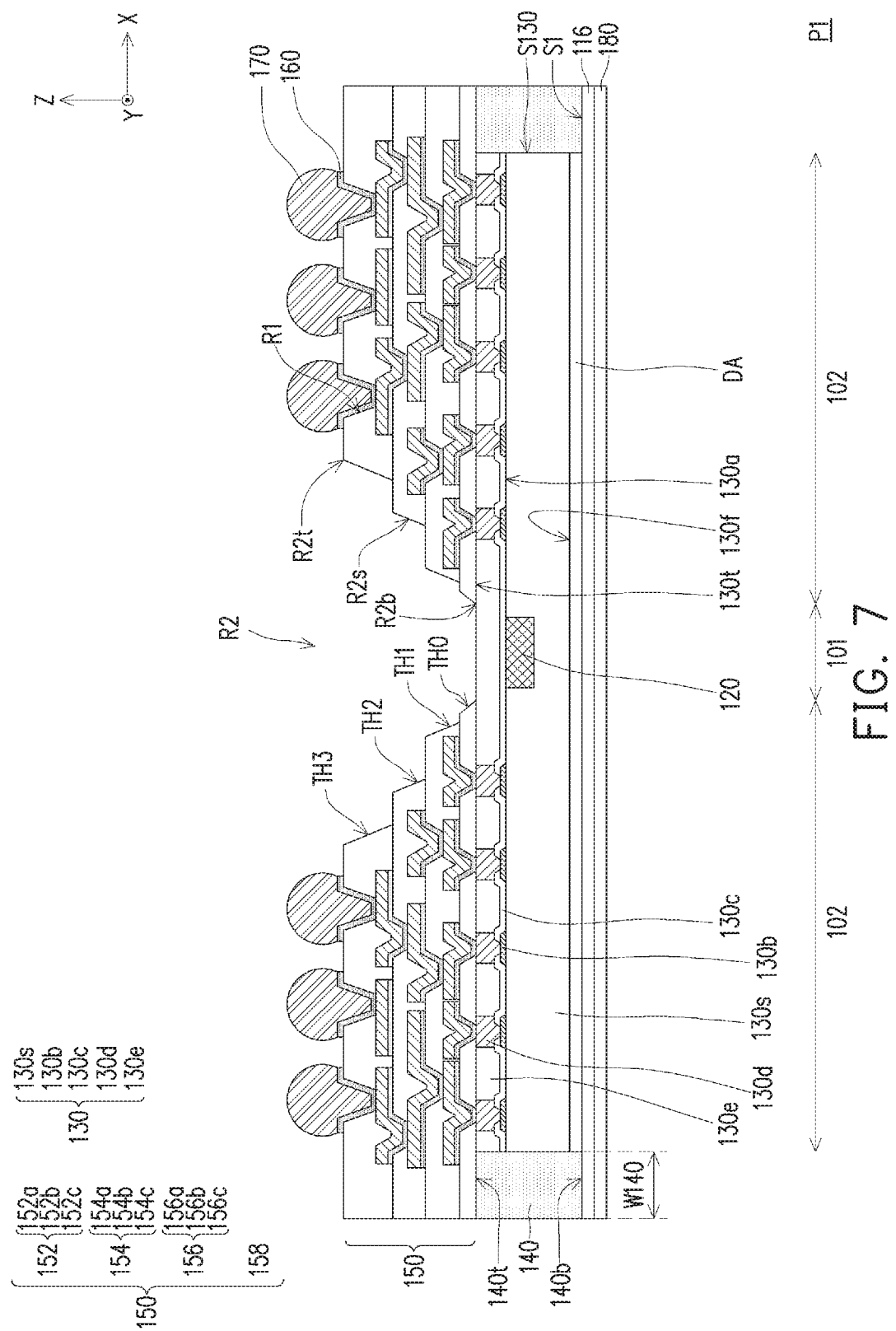

Referring to FIG. 6 and FIG. 7 together, in some embodiments, the conductive elements 170 are released from the holding device HD to form a semiconductor structure P1. In some embodiments, prior to releasing the conductive elements 170 from the holding device HD, a dicing (singulation) process is performed to cut a plurality of semiconductor structures P1 interconnected therebetween into individual and separated semiconductor structures P1. In one embodiment, the dicing (singulation) process is a wafer dicing process including mechanical blade sawing or laser cutting. The disclosure is not limited thereto. Up to here, the manufacture of the semiconductor structure P1 is manufactured.

As illustrated in FIG. 7, the semiconductor structure P1 includes the protection layer 180, the semiconductor die 130 (including the sensor device 120), the insulating encapsulation 140, the redistribution circuit structure 150 and the conductive elements 170, for example. In some embodiments, the semiconductor structure P1 further include at least one of the connecting film DA, the buffer layer 116 and the UBM patterns 160. In some embodiments, the semiconductor die 130 is disposed on a side of the protection layer 180 and laterally encapsulated by the insulating encapsulation 140. For example, the protection layer 180 is located on the bottom surface 130f of the semiconductor die 130 and extends over the bottom surface 140b of the insulating encapsulation 140, where the bottom surface 130b is substantially coplanar to the bottom surface 140b. The buffer layer 116 is located between the protection layer 180 and the semiconductor die 130 and between the protection layer 180 and the insulating encapsulation 140, where the connecting film DA is located between the buffer layer 116 and the semiconductor die 130 and laterally encapsulated by the insulating encapsulation 140. As shown in FIG. 7 and FIG. 8, a width W140 of the insulating encapsulation 140 is approximately ranging from 10 μm to 1000 μm. Due to the protection layer 180 and the insulating encapsulation 140 (with specific thicknesses/material), the sidewall S130 and the bottom surface 130f of the semiconductor die 130 are covered by the insulating encapsulation 140 and the protection layer 180, thus the IR interference caused by the external environment to the semiconductor die 130 (e.g., the sensor device 120) may be suppressed, thereby enhancing the reliability in photo-sensing performance of the semiconductor structure P1.

In some embodiments, the redistribution circuit structure 150 is located on the insulating encapsulation 140 and the semiconductor die 130, and is electrically connected to the semiconductor die 130. The conductive elements 170 are located on the redistribution circuit structure 150, and are electrically connected to the redistribution circuit structure 150 through the UBM patterns 160. In some embodiments, the conductive elements 170 are electrically connected to the semiconductor die 130 through the UBM patterns 160 and the redistribution circuit structure 150. As shown in FIG. 7 and FIG. 8, for example, the connection pads 130b and the connection vias 130d of the semiconductor die 130, the metallization layers (e.g., the seed layers 154 and the patterned conductive layers 156) of the redistribution circuit structure 150 and the conductive elements 170 (with the UBM patterns 160) are located within the second region 102, and the sensor device 120 is located within the first region 101. The first region 101 is surrounded by the second region 102, for example. In some embodiments, the recess R2 is formed in and penetrates through the redistribution circuit structure 150 over the first region 101, such that the redistribution circuit structure 150 has the thickness (not exist) over the first region 101 less than the thickness (T150) over the second region 102. Due to the positioning configurations of the recess R2 and the sensor device 120, the intensity of the light signals receiving by the sensor device 120 for processing is enhance, thereby improving the photo-sensing performance of the semiconductor structure P1.

Figure 10:
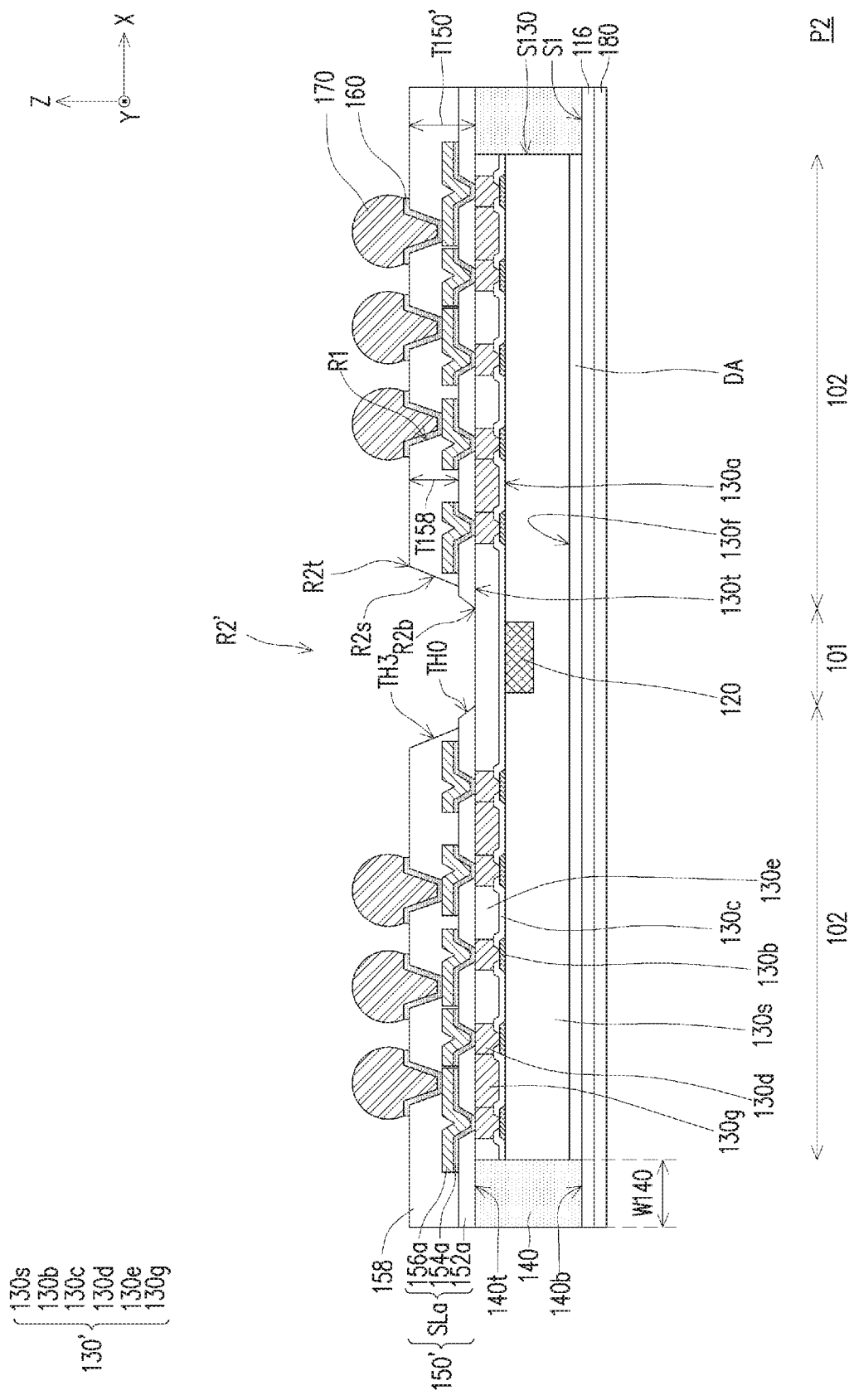
FIG. 10 is a schematic cross-sectional view of a semiconductor structure in accordance with some embodiments of the disclosure.
Figure 11:
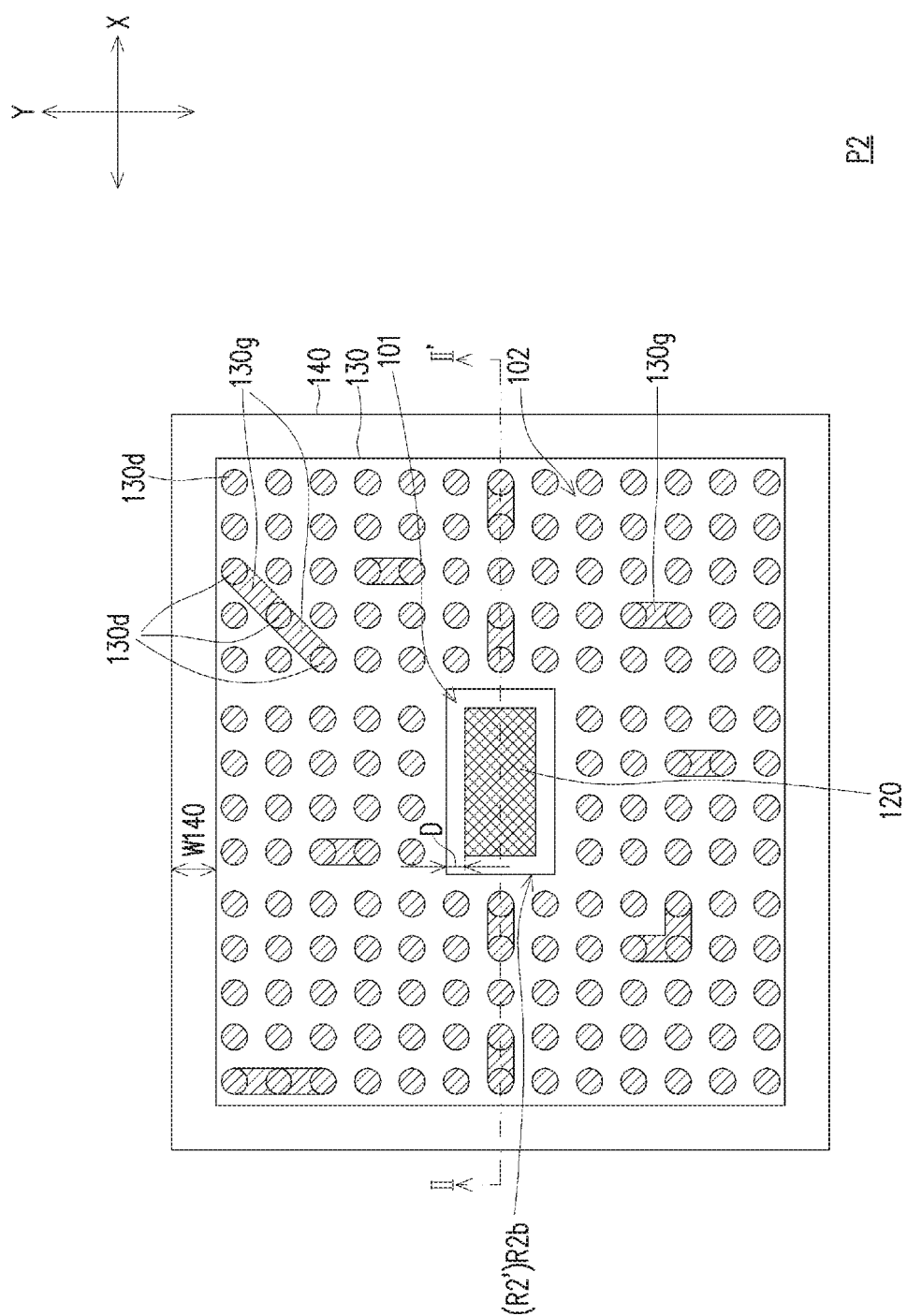
FIG. 11 is a schematic top view respectively illustrating a positioning location of a sensor device in a semiconductor structure in accordance with some embodiments of the disclosure.

FIG. 10 is a schematic cross-sectional view of a semiconductor structure in accordance with some embodiments of the disclosure. FIG. 11 is a schematic top view respectively illustrating a positioning location of a sensor device in a semiconductor structure in accordance with some embodiments of the disclosure, where FIG. 10 is the cross-sectional view taken along a cross-sectional line II-II' depicted in FIG. 11. The elements similar to or substantially the same as the elements described previously will use the same reference numbers, and certain details or descriptions (e.g. the materials, formation processes, positioning configurations, etc.) of the same elements would not be repeated herein. Referring to FIG. 7 through FIG. 8 and FIG. 10 through FIG. 11, for example, a semiconductor structure P2 depicted in FIG. 10 and FIG. 11 is similar to the semiconductor structure P1 depicted in FIG. 7 and FIG. 8; the difference is that, in the semiconductor structure P2, the redistribution circuit structure 150 is substituted by a redistribution circuit structure 150' (e.g., with less build-up layers), and an addition element, an auxiliary connection trace 130g, is further included in the semiconductor die 130. With the presence of the auxiliary connection trace 130g, the connection vias 130d and the auxiliary connection trace 130g work together to provide an additional routing function for the semiconductor die 130 as a compensation of the redistribution circuit structure 150' (e.g., with less build-up layers). In some embodiments, the auxiliary connection trace 130g includes a plurality of auxiliary connection traces 130g, as shown in FIG. 10 and FIG. 11.

As illustrated in FIG. 10 and FIG. 11, in some embodiments, the redistribution circuit structure 150' is formed on and connected to the semiconductor die 130. For example, the redistribution circuit structure 150' is electrically connected to the semiconductor die 130 through the first build-up layer SL (e.g. the patterned conductive layer 156a) and the connection vias 130d, where a recess R2' (e.g., the trenches TH3 and TH0) is formed in and penetrates through the redistribution circuit structure 150' over the first region 101. The details of the recess R2' is the same or similar to the recess R2 as described in FIG. 4, thus is not repeated herein for brevity. Due to the redistribution circuit structure 150' includes less build-up layers, such as one build-up layer (e.g., SLa), the overall thickness of the semiconductor structure P2 is reduced. With such embodiments, the auxiliary connection traces 130g are further formed on the passivation layer 130c, and are connected to the connection vias 130d. For example, each of the auxiliary connection traces 130g is disposed on the passivation layer 130c over the second region 102 for connecting two or more than two connections vias 130d, such that these two or more than two connection vias 130d are electrically connected to each other through one of the auxiliary connection traces 130g. The auxiliary connection traces 130g and the connection vias 130d together work as an additional redistribution circuit providing the additional routing function for the semiconductor die 130, for example. With combining the auxiliary connection traces 130g (in addition to the connection vias 130d connected thereto) and the redistribution circuit structure 150', the routing function for the semiconductor die 130 included in the semiconductor structure P2 is ensured. The formation and material of the auxiliary connection traces 130g are similar to the connection vias 130d, and thus are not repeated for brevity. The auxiliary connection traces 130g and the connection vias 130d may be formed in the same step. Alternatively, the auxiliary connection traces 130g and the connection vias 130d may be formed in different steps.

Figure 12:
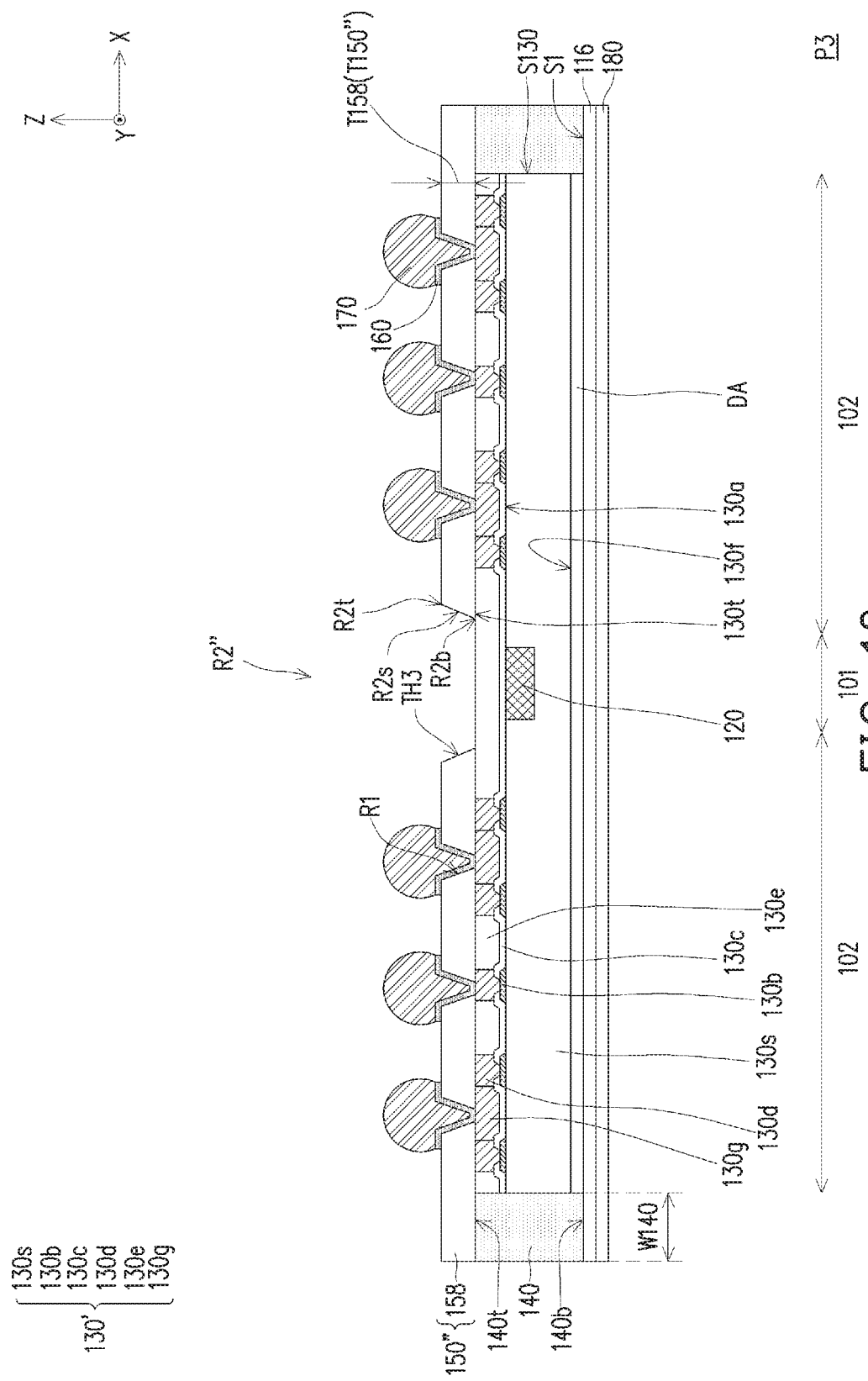
FIG. 12 is a schematic cross-sectional view of a semiconductor structure in accordance with some embodiments of the disclosure.
Figure 13:
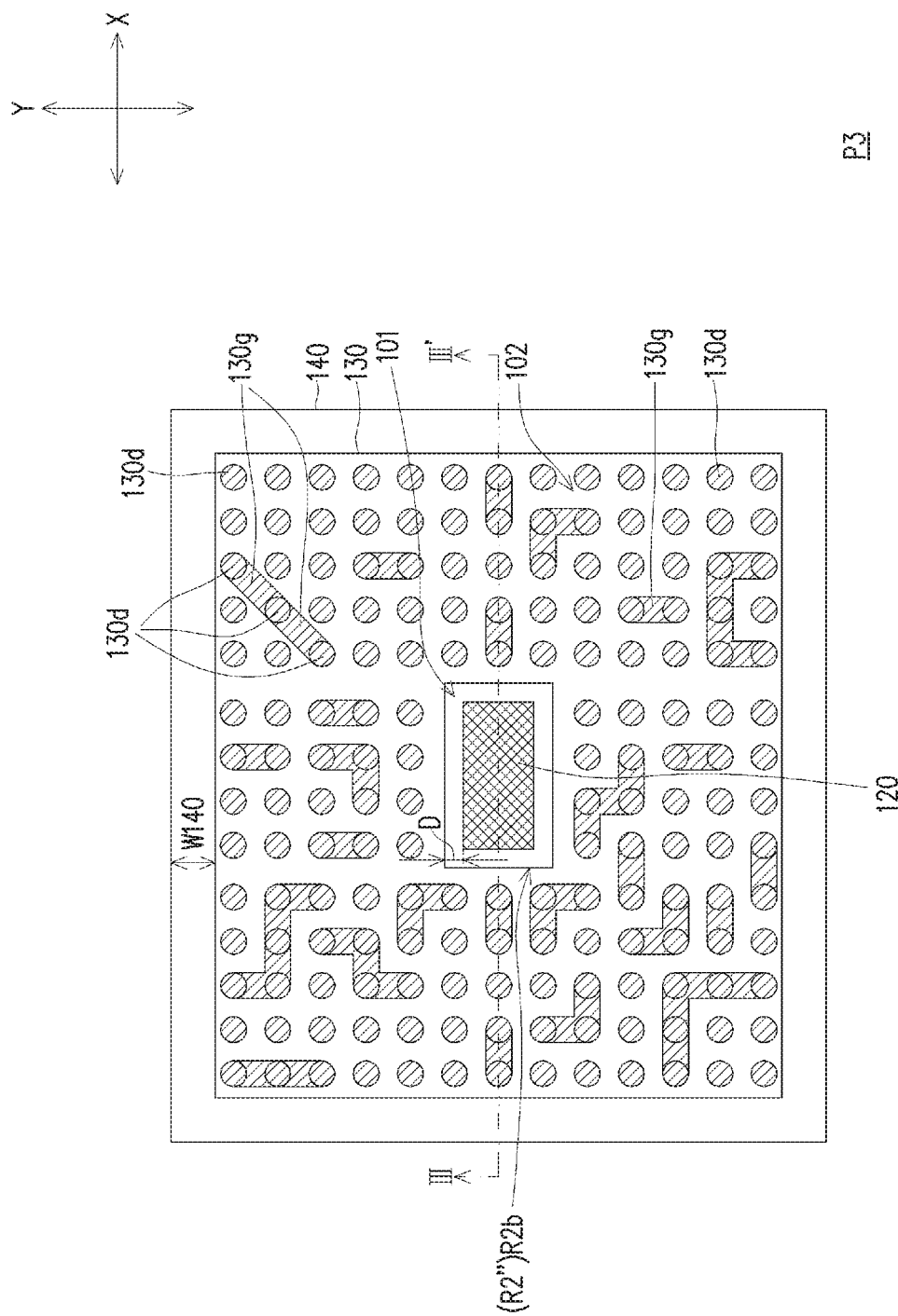
FIG. 13 is a schematic top view respectively illustrating a positioning location of a sensor device in a semiconductor structure in accordance with some embodiments of the disclosure.

FIG. 12 is a schematic cross-sectional view of a semiconductor structure in accordance with some embodiments of the disclosure. FIG. 13 is a schematic top view respectively illustrating a positioning location of a sensor device in a semiconductor structure in accordance with some embodiments of the disclosure, where FIG. 12 is the cross-sectional view taken along a cross-sectional line III-III' depicted in FIG. 13. Referring to FIG. 10 through FIG. 11 and FIG. 12 through FIG. 13, for example, a semiconductor structure P3 depicted in FIG. 12 and FIG. 13 is similar to the semiconductor structure P2 depicted in FIG. 10 and FIG. 11; the difference is that, in the semiconductor structure P3, the redistribution circuit structure 150' is substituted by a redistribution circuit structure 150" (e.g., without build-up layers).

As illustrated in FIG. 12 and FIG. 13, in some embodiments, the redistribution circuit structure 150" is formed on and connected to the semiconductor die 130. For example, the redistribution circuit structure 150" includes the dielectric layer 158, where the dielectric layer 158 has the recesses R1 located over the second region 102 and a recess R2" (e.g., the trench TH3) over the first region 101. For example, the recesses R1 define locations of the connection vias 130d and/or the connection traces 130g for electrical connecting the conductive element 170. In some embodiments, the recess R2" is formed in and penetrates through the redistribution circuit structure 150" (e.g., the dielectric layer 158) over the first region 101. The details of the recess R2" is similar to the recess R2 as described in FIG. 4, thus is not repeated herein for brevity. Due to the redistribution circuit structure 150" (including no build-up layer), the overall thickness of the semiconductor structure P3 is greatly reduced. In addition, due to there is no build-up layer (e.g., the patterned conductive layers 156), the density of the auxiliary connection traces 130g included in the semiconductor die 130 of the semiconductor structure P3 may be much greater than the density of the auxiliary connection traces 130g included in the semiconductor die 130 of the semiconductor structure P2. With such, the connection vias 130d and the auxiliary connection trace 130g work together as a redistribution circuit to provide a sufficient routing function for the semiconductor die 130 as a compensation of the redistribution circuit structure 150" (e.g., with no build-up layers). Per such high density of the auxiliary connection traces 130g, the routing function for the semiconductor die 130 included in the semiconductor structure P3 is ensured. However, the disclosure is not limited thereto; in alternative embodiments, the density of the auxiliary connection traces 130g included in the semiconductor die 130 of the semiconductor structure P3 may be less than or equal to the density of the auxiliary connection traces 130g included in the semiconductor die 130 of the semiconductor structure P2 based on the demand and design layout.

Figure 14:
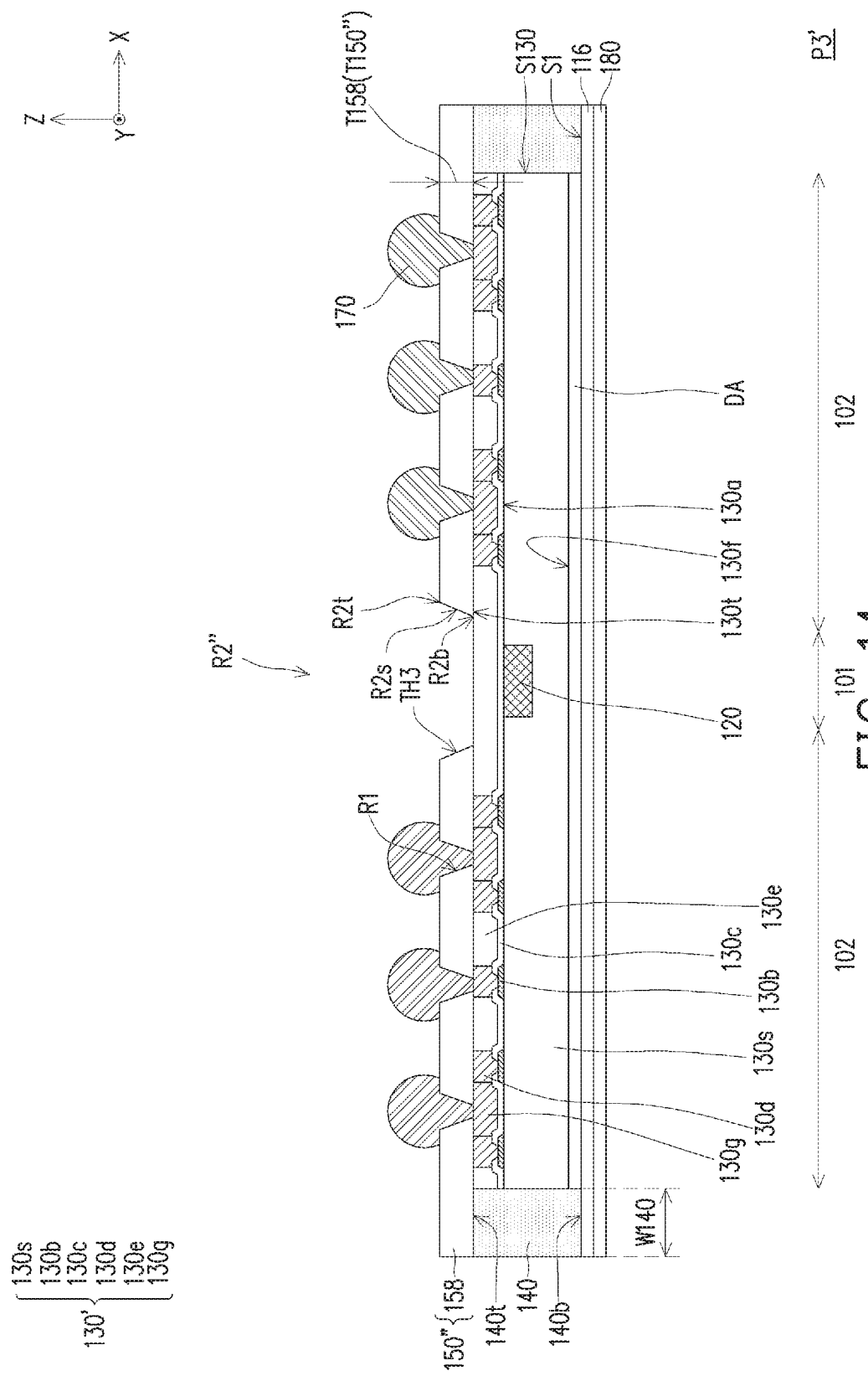
FIG. 14 is a schematic cross-sectional view of a semiconductor structure in accordance with some embodiments of the disclosure.

Alternatively, the UBM patterns 160 may further omitted (e.g., a package structure P3' of FIG. 14). In the embodiments of which the UBM patterns 160 are omitted, the conductive elements 170 may be directly connected to the connection vias 130d and/or the auxiliary connection traces 130g exposed by the redistribution circuit structure 150" (e.g., exposed by the recesses R1). The disclosure is not limited thereto.

In some embodiments, through the conductive elements 170 and/or other additional connectors, the semiconductor structures P1, P1', P2, P3 and P3' may be further mounted with a (semiconductor) circuit substrate (e.g. an organic substrate with circuitry structure embedded therein, such as printed circuit board (PCB)), an interposer, an additional package, chips/dies or other electronic devices, to form a stacked package structure, the disclosure is not limited thereto. The stacked package structure may include an integrated fan-out (InFO) package structure, a flip chip structure package structure, a chip-on-wafer-on-substrate (CoWoS) package structure, or a package-on-package (PoP) structure. The disclosure is not limited thereto.

In accordance with some embodiments, a semiconductor structure includes a semiconductor die, an insulating encapsulation, a passivation layer and conductive elements. The semiconductor die includes a sensor device and a semiconductor substrate with a first region and a second region adjacent to the first region, and the sensor device is embedded in the semiconductor substrate within the first region. The insulating encapsulation laterally encapsulates the semiconductor die and covers a sidewall of the semiconductor die. The passivation layer is located on the semiconductor die, wherein a recess penetrates through the passivation layer over the first region and is overlapped with the sensor device. The conductive elements are located on the passivation layer over the second region and are electrically connected to the semiconductor die, wherein the passivation layer is between the insulating encapsulation and the conductive elements.

In accordance with some embodiments, a semiconductor structure includes a semiconductor die, an insulating encapsulation, a redistribution circuit structure and a protection layer. The semiconductor die includes a semiconductor substrate with a first region and a second region surrounding the first region and a sensor device embedded in the semiconductor substrate within the first region. The insulating encapsulation laterally encapsulates the semiconductor die. The redistribution circuit structure is located on and electrically connected to the semiconductor die, wherein the redistribution circuit structure has a first thickness within the first region and a second thickness within the second region, and the second thickness is greater than the first thickness along a stacking direction of the semiconductor die and the redistribution circuit structure. The protection layer is located on the semiconductor die, wherein the semiconductor die and the insulating encapsulation are between the redistribution circuit structure and the protection layer.

In accordance with some embodiments, a method of manufacturing semiconductor structure includes the following steps, providing a semiconductor die having a semiconductor substrate with a first region and a second adjacent to the first region and a sensor device embedded in the semiconductor substrate within the first region; laterally encapsulating the semiconductor die in the semiconductor die; forming a passivation layer on the semiconductor die and the insulating encapsulation and forming a first recess penetrating the passivation layer over the first region and second recesses penetrating the passivation layer over the second region, the first recess being overlapped with the sensor device and the second recesses being aside of the sensor device; and disposing conductive elements on the passivation layer over the second region and extending into the second recesses to electrically connect to the semiconductor die.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A semiconductor structure, comprising:
a semiconductor die, comprising a sensor device, a dielectric layer and a semiconductor substrate with a first region and a second region adjacent to the first region, the dielectric layer extending over the first region and the second region of the semiconductor substrate, and the sensor device being embedded in the semiconductor substrate within the first region, wherein the dielectric layer covers a first surface of the sensor device exposing from a second surface of the semiconductor substrate;
an insulating encapsulation, laterally encapsulating the semiconductor die and covering a sidewall of the semiconductor die;
a die attach film, disposed on a third surface of the semiconductor substrate, the third surface being opposite to the second surface, wherein a surface of the die attach film being opposite to the third surface is substantially coplanar to a fourth surface of the insulating encapsulation;
a passivation layer, located on the semiconductor die, wherein a recess penetrates through the passivation layer over the first region and is overlapped with the sensor device, and through holes penetrate through the passivation layer over the second region, wherein the recess has a side surface and a bottom surface connecting to the side surface, and the entire side surface and the entire bottom surface are dielectric surfaces, wherein a portion of the dielectric layer covering the sensor device within the first region is exposed by the recess;
solder balls, located on the passivation layer over the second region, and electrically connected to the semiconductor die, wherein the passivation layer is between the insulating encapsulation and the solder balls, and each of the solder balls is located at a respective one of the through holes, respectively; and
a protection layer, located on the semiconductor die, wherein the semiconductor die and the insulating encapsulation are between the passivation layer and the protection layer.

2. The semiconductor structure of claim 1, wherein:
the passivation layer has a first thickness within the first region and a second thickness within the second region, and the first thickness is less than the second thickness along a stacking direction of the semiconductor die and the passivation layer, wherein:
along the stacking direction, the bottom surface is closer to the sensor device than a top opening of the recess is, and
along a direction perpendicular to the stacking direction, a first width of the top opening is greater than or substantially equal to a second width of the bottom surface.

3. The semiconductor structure of claim 2, wherein a perimeter of the bottom surface of the recess is substantially aligned with a perimeter of the sensor device.

4. The semiconductor structure of claim 2, wherein a perimeter of the bottom surface of the recess is aside of and encloses around a perimeter of the sensor device, and an offset is between the perimeter of the sensor device and the perimeter of the bottom surface of the recess.

5. The semiconductor structure of claim 2, wherein in a cross section of the recess, the side surface is in a form of a substantially slant line or a substantially vertical line.

6. The semiconductor structure of claim 1, further comprising:
a redistributing circuit structure, located on and electrically connected to the semiconductor die, and comprising one or more interlayer dielectric layers and one or more metallization layers stacked alternatively,
wherein the passivation layer is located on and partially exposes an outermost layer of the one or more metallization layers, the outermost layer of the one or more metallization layers partially exposed by the passivation layer is electrically connected to the solder balls, and an outermost layer of the one or more interlayer dielectric layers is the passivation layer,
wherein the recess further penetrates through the redistribution circuit structure located over the first region.

7. The semiconductor structure of claim 6, wherein the redistribution circuit structure has a thickness within the first region being less than a thickness within the second region along a stacking direction of the semiconductor die and the passivation layer.

8. The semiconductor structure of claim 6, wherein in a cross section of the recess, the side surface of the recess is in a form of a substantially slant line, a substantially vertical line, a plurality of substantially slant lines and substantially horizontal lines interconnected in alternation, or a plurality of substantially vertical lines and substantially horizontal lines interconnected in alternation.

9. The semiconductor structure of claim 6, wherein a size of the recess is greater than or substantially equal to a size of the sensor device.

10. The semiconductor structure of claim 6, wherein a portion of the redistribution circuit structure over the first region is free of the one or more metallization layers.

11. The semiconductor structure of claim 1, wherein the protection layer covers a rear surface of the semiconductor die and extends onto a surface of the insulating encapsulation, and the surface of the insulating encapsulation is substantially coplanar to the rear surface of the semiconductor die, and wherein the protection layer comprises a lamination compound tape.

12. The semiconductor structure of claim 1, wherein the semiconductor die further comprises:
a plurality of connection vias, distributed on an active surface of the semiconductor substrate; and
a plurality of auxiliary connection traces, over the semiconductor substrate and each electrically connecting two of the plurality of connection vias.

13. A semiconductor structure, comprising:
a semiconductor die, comprising a semiconductor substrate with a first region and a second region surrounding the first region, conductive vias on an active surface of the semiconductor substrate within the second region, a dielectric layer located on the active surface within the first region and the second region and laterally covering the conductive vias, and a sensor device embedded in the semiconductor substrate within the first region, wherein the dielectric layer covers a surface of the sensor device exposing from the active surface of the semiconductor substrate;
an insulating encapsulation, laterally encapsulating the semiconductor die and separating from the conductive vias through the dielectric layer, wherein a surface of the dielectric layer is substantially coplanar with a first surface of the insulating encapsulation;
a die attach film, disposed on a rear surface of the semiconductor substrate, the rear surface being opposite to the active surface, wherein a surface of the die attach film being opposite to the rear surface is substantially coplanar to a second surface of the insulating encapsulation opposite to the first surface of the insulating encapsulation;
a redistribution circuit structure, located on and electrically connected to the semiconductor die, wherein the redistribution circuit structure has a first thickness within the first region and a second thickness within the second region, and the second thickness is greater than the first thickness along a stacking direction of the semiconductor die and the redistribution circuit structure, and wherein a recess is disposed in and penetrates through the redistribution circuit structure, the recess is located atop the first region and overlapped with the sensor device, and a portion of the dielectric layer covering the sensor device within the first region is exposed by the recess, wherein the recess has a side surface and a bottom surface connecting to the side surface, and the entire side surface and the entire bottom surface are dielectric surfaces; and
a protection layer, located on the semiconductor die, wherein the semiconductor die and the insulating encapsulation are between the redistribution circuit structure and the protection layer.

14. The semiconductor structure of claim 13, further comprising:
conductive elements, located on and electrically connected to the redistribution circuit structure, wherein the redistribution circuit structure is between the insulating encapsulation and the conductive elements, and the conductive elements are distributed over the second region of the semiconductor substrate and aside of the first region,
wherein a sidewall of the dielectric layer is covered by the insulating encapsulation, and the surface of the sensor device and the active surface of the semiconductor substrate are substantially coplanar to each other.

15. The semiconductor structure of claim 13, wherein the redistribution circuit structure comprises at least one redistribution conductive layer and at least one redistribution dielectric layer alternately arranged, the at least one redistribution conductive layer is disposed on the conductive vias and covered by the passivation layer, and the at least one redistribution dielectric layer is disposed between the passivation layer and the insulating encapsulation and between the passivation layer and the dielectric layer.

16. The semiconductor structure of claim 13, wherein the protection layer further extends over the second surface of the insulating encapsulation, and the protection layer comprises an infrared blocking layer or a lamination compound tape.

17. The semiconductor structure of claim 13, wherein the sensor device comprises one or more than one photosensitive diode.

18. A method of manufacturing a semiconductor structure, comprising:
providing a semiconductor die with a die attach film disposed thereon, the semiconductor die having a semiconductor substrate with a first region and a second region adjacent to the first region, a sensor device embedded in the semiconductor substrate within the first region, and a dielectric layer extending over the first region and the second region of the semiconductor substrate and covering a first surface of the sensor device exposing from a second surface of the semiconductor substrate, wherein the die attach film is disposed on a third surface of the semiconductor substrate, and the third surface being opposite to the second surface;
laterally encapsulating the semiconductor die in an insulating encapsulation, wherein a surface of the die attach film being opposite to the third surface is substantially coplanar to a fourth surface of the insulating encapsulation;
forming a passivation layer on the semiconductor die and the insulating encapsulation and forming a first recess penetrating the passivation layer over the first region and second recesses penetrating the passivation layer over the second region, the first recess being overlapped with the sensor device and the second recesses being aside of the sensor device, wherein the first recess has a side surface and a bottom surface connecting to the side surface, and the entire side surface and the entire bottom surface are dielectric surfaces;
disposing solder balls on the passivation layer over the second region and extending into the second recesses to electrically connect to the semiconductor die, wherein each of the solder balls is located at a respective one of the second recesses, respectively, and wherein a portion of the dielectric layer covering the sensor device within the first region is exposed by the first recess; and
forming a protection layer over the semiconductor die and the insulating encapsulation, the semiconductor die and the insulating encapsulation being between the passivation layer and the protection layer.

19. The method of claim 18, wherein forming the passivation layer on the semiconductor die and the insulating encapsulation comprises forming a redistribution circuit structure on the semiconductor die and the insulating encapsulation, wherein the redistribution circuit structure is electrically connected to the semiconductor die, the protection layer comprises a lamination compound tape, and forming the redistribution circuit structure comprises:

forming one or more interlayer dielectric layers and one or more metallization layers in alternation, wherein an outermost layer of the one or more interlayer dielectric layers partially exposes an outermost layer of the one or more metallization layers for electrically connecting the solder balls, and the outermost layer of the one or more interlayer dielectric layers comprises the passivation layer.

20. The method of claim 18, wherein providing the semiconductor die comprises picking-and-placing the semiconductor die.

\* \* \* \* \*